(12) United States Patent
Chang-Hasnain et al.

(10) Patent No.: US 8,755,118 B2
(45) Date of Patent: Jun. 17, 2014

(54) PLANAR, HIGH NA, LOW LOSS TRANSMITTING OR REFLECTING LENSES USING SUB-WAVELENGTH HIGH CONTRAST GRATING

(75) Inventors: Connie Chang-Hasnain, Palo Alto, CA (US); Christopher Chase, Kensington, CA (US); Fanglu Lu, Berkeley, CA (US); Forrest G. Sedgwick, Berkeley, CA (US); Vadim Karagodsky, Berkeley, CA (US); Igor Karagodsky, legal representative, Brighton, MA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/593,382

(22) Filed: Aug. 23, 2012

(65) Prior Publication Data
US 2013/0058370 A1 Mar. 7, 2013

Related U.S. Application Data

(63) Continuation of application No. PCT/US2011/026112, filed on Feb. 24, 2011.

(60) Provisional application No. 61/307,843, filed on Feb. 24, 2010, provisional application No. 61/334,417, filed on May 13, 2010.

(51) Int. Cl.
*G02B 5/18* (2006.01)

(52) U.S. Cl.
CPC .................................. *G02B 5/1861* (2013.01)
USPC .......................................... 359/572; 359/576

(58) Field of Classification Search
USPC ............. 359/485.08, 487.03, 489.06, 489.08, 359/489.19, 489.16–489.17, 489.2, 558, 359/565, 569–575
See application file for complete search history.

(56) References Cited

U.S. PATENT DOCUMENTS

| 7,057,819 | B1 | 6/2006 | Maheshwari | |
|---|---|---|---|---|
| 2009/0020690 | A1* | 1/2009 | Toda | 250/227.2 |
| 2012/0105962 | A1* | 5/2012 | Fattal et al. | 359/575 |

FOREIGN PATENT DOCUMENTS

| JP | 09-033393 A | 2/1997 |
|---|---|---|
| KR | 10-2006-0022062 A | 3/2006 |
| KR | 10-0779693 B1 | 11/2007 |

OTHER PUBLICATIONS

Korean Intellectual Property Office (KIPO), International Search Report and Written Opinion issued on Nov. 25, 2011 (pp. 1-10), including claims searched (pp. 10-16), related PCT International Patent Application PCT/US2011/026112, pp. 1-16.

*Primary Examiner* — Scott J Sugarman
*Assistant Examiner* — Robert E Tallman
(74) *Attorney, Agent, or Firm* — John P. O'Banion

(57) ABSTRACT

Planar lenses and reflectors are described comprising sub-wavelength high-contrast gratings (HCG) having high index of refraction grating elements spaced apart from one another in straight and/or curved segments and surrounded by low index material. The high-contrast grating is configured to receive an incident wave which excites multiple modes within the high-contrast grating and is focused for reflection and/or transmission by said high contrast grating. The width of the high contrast grating bars vary along a distribution direction of the grating bars which is perpendicular to the length of the grating bars and/or varies along the length of one or more grating bars to focus said reflection and/or transmission. The HCG is configured to provide double focusing, whose use is exemplified within a vertical cavity surface emitting laser (VCSEL) structure using focusing HCG structures for both the top and bottom mirrors.

19 Claims, 31 Drawing Sheets

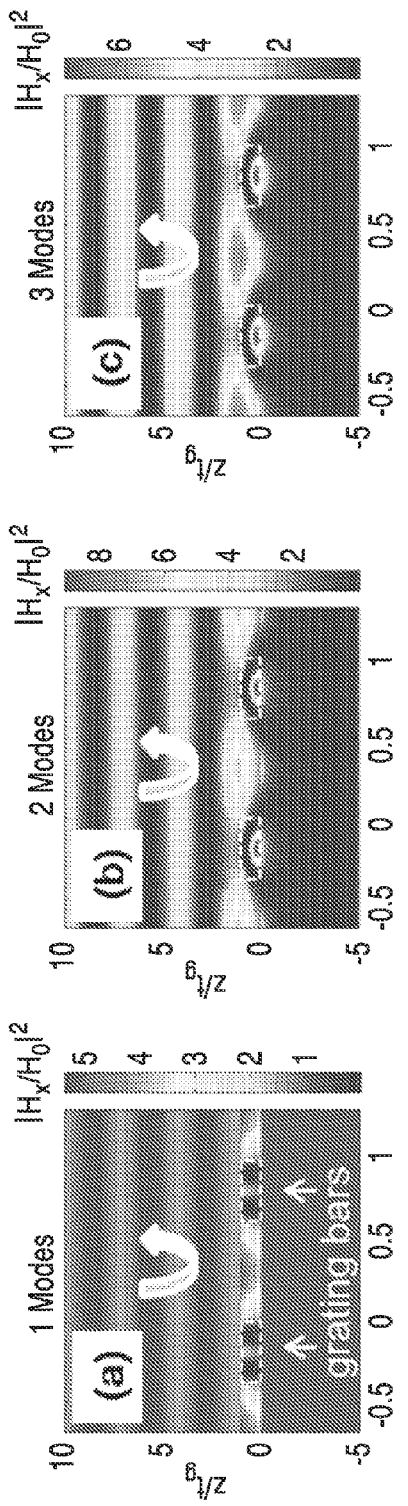
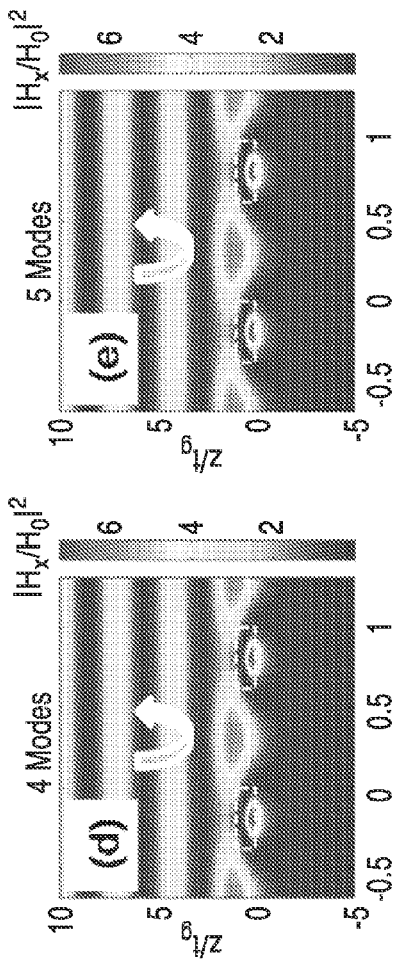
FIG. 7A  FIG. 7B  FIG. 7C  FIG. 7D  FIG. 7E

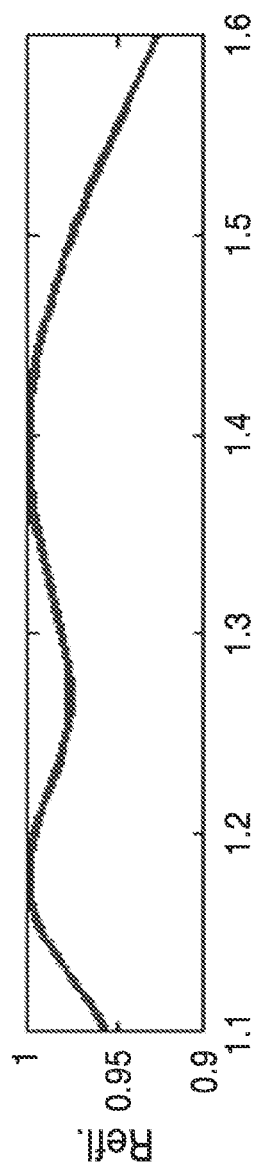
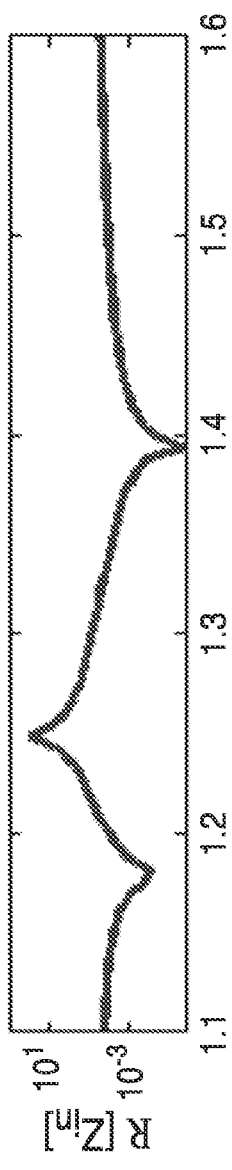
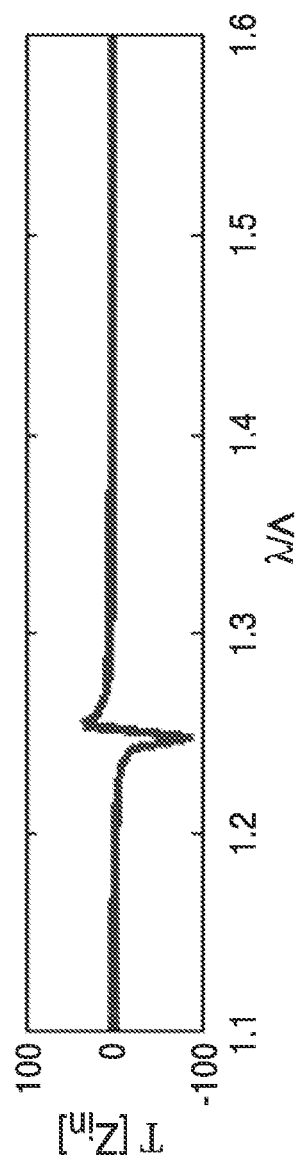
FIG. 10A
FIG. 10B
FIG. 10C

PLANAR, HIGH NA, LOW LOSS TRANSMITTING OR REFLECTING LENSES USING SUB-WAVELENGTH HIGH CONTRAST GRATING

CROSS-REFERENCE TO RELATED APPLICATIONS

This application a 35 U.S.C. §111(a) continuation of PCT international application number PCT/US2011/026112 filed on Feb. 24, 2011, incorporated herein by reference in its entirety, which is a nonprovisional of U.S. provisional patent application Ser. No. 61/307,843 filed on Feb. 24, 2010, incorporated herein by reference in its entirety, and a nonprovisional of U.S. provisional patent application Ser. No. 61/334,417 filed on May 13, 2010, incorporated herein by reference in its entirety. Priority is claimed to each of the foregoing applications.

The above-referenced PCT international application was published as PCT International Publication No. WO 2011/106553 on Sep. 1, 2011 and republished on Jan. 19, 2012, and is incorporated herein by reference in its entirety.

STATEMENT REGARDING FEDERALLY SPONSORED RESEARCH OR DEVELOPMENT

This invention was made with Government support under Grant No. N00244-09-1-0013 awarded by the Department of Defense, and Grant No. Y503161 awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to optical focusing reflectors and lenses, and more particularly to high contrast gratings configured as planar focusing lenses and reflectors.

2. Description of Related Art

Numerous optical devices require the inclusion of one or more focusing reflectors and/or lenses for proper functioning. Difficulties arise with integrating these optical lenses, and reflectors, requiring precisely curved surfaces and optical properties into devices, such as semiconductor devices, that may include vertical cavity surface emitting lasers (VCSEL) and the like. Various techniques have been proposed for simplifying these fabrication processes, such as fabricating standing structures around emitting areas of multiple VCSELs and using these structures for retaining ball lenses or other optical elements. It is also necessary to provide alignment of these optical elements with the remainder of the device structure. Additionally, numerous problems arise with the thickness of conventional lenses and reflectors being integrated within optical devices.

Focusing reflectors and lenses are perhaps the most fundamental components in applications involving manipulation of light, including imaging, communications, display, sensing, solar cells and measurements. Systems and devices in all these areas benefit from monolithic integration and the corresponding decreases in size, weight, and costs. Integration of focusing elements requires a design which is compatible with standard microfabrication processes while offering comparable or better performance relative to bulk optics.

Of all the parameters of a reflector or lens, numerical aperture (NA) is perhaps most critical because it indicates the focusing or resolving power of a reflector or lens. The focusing/defocusing capability of conventional simple lenses arises from the shape of the lens and the index contrast between the lens material and air. Because the lens must be transparent, the choice of material is limited and the highest refractive index is approximately two, which limits the NA of conventional lenses. Conventional focusing reflectors are typically curved mirrors made of glass coated with metal. The focusing capability of a reflector arises from its aspherical shape, enabling high NA. However, both the lens and reflector require an aspheric shape and bulky thickness, presenting difficulties for standard microfabrication techniques.

Zone plates and Fresnel lenses are attractive alternatives to simple lenses because they are planar and compact. A zone plate consists of a set of radially symmetric rings which alternate between opaque and transparent, harnessing diffraction to create a lensing effect. The major drawback of zone plates is that they absorb a significant part of the input power, making them undesirable for any optical application where low loss is required.

Fresnel lenses are a planar alternative which consists of many concentric segments having continuous height variations. The quality of a Fresnel lens depends on the number of segments and the accuracy of the height variation. However, at the microscales necessary for device fabrication, the creation of Fresnel lenses becomes difficult. So although high NA is achievable with a Fresnel lens, incorporating Fresnel lenses within integrated optics applications is problematic.

Accordingly, there is a need for small, light, and inexpensive focusing structures (lenses and reflectors) which can be readily integrated within semiconductor circuit devices. The present invention fulfills that need and others, while extending the range of applications into which the lenses and reflectors can be cost-effectively integrated.

BRIEF SUMMARY OF THE INVENTION

The present invention describes the use of subwavelength High-Contrast Gratings (HCG) configured for use as focused lenses and/or reflectors which can be integrated within a wide range of devices. For the sake of simplicity of description, the term "HCG lens" used herein can generally be applied to these HCG structures regardless of their relative transmissivity and reflectivity at the wavelength of interest.

Subwavelength high-contrast gratings have a high index material grating which is surrounded by a low index material. The incident wave excites multiple modes within the HCG which propagates into the grating and bounces back at the bottom output plane. The extent of reflection and transmission can be controlled by the parameters of the HCG.

HCG devices have been shown to be extremely effective as highly reflective, broadband mirrors. Application has been made of these devices to replace conventional mirrors, such as DBR mirrors, while selecting preferred lasing polarization. These devices have also been demonstrated as a high-Q resonator, for mirror sidewalls of a hollow waveguide, and are particularly well-suited for MEMS-based applications because of their small size, which allows them to be tuned more rapidly. In wavelength-tunable VCSELs, subwavelength high-contrast gratings have been shown to increase tuning speed by over an order of magnitude.

The present invention teaches HCG-based planar lenses, both for optical transmission and/or reflection. These subwavelength HCG-based lens-reflectors provide high resolving power, engineered phase and low loss. HCG-based lens-reflectors are configured to provide a desired phase distribution. One embodiment describes a transmitting lens with high NA of 0.96, low loss of 0.2 dB, a reflecting lens of high NA of 0.81, and with a low loss of 0.3 dB. It will be appreciated that these lens-reflectors can be readily integrated within various circuits, such as CCD and CMOS integrated circuits, to enable higher resolution imaging and other applications.

The invention is amenable to being embodied in a number of ways, including but not limited to the following descriptions.

One embodiment of the invention is an apparatus for focusing optical energy, comprising: (a) a high-contrast grating (HCG) having grating elements spaced apart from one another, in which the high-contrast grating elements having subwavelength dimensions and an index of refraction at or exceeding approximately three; (b) a low index of refraction material, or materials, surrounding the grating elements, wherein the grating is planar and configured to receive an incident wave which excites multiple modes within the high-contrast grating and is focused for reflection and/or transmission by the high contrast grating; (c) wherein grating element width and spacing varies to focus the reflection and/or transmission to a desired location in relation to the grating.

At least one embodiment of the invention is configured so that the high-contrast grating provides either high reflectivity, partial reflectivity, or high transmissivity. In at least one embodiment of the invention the high-contrast grating is configured for choosing phase of reflectivity and/or transmission independent from amplitude. In at least one embodiment of the invention the high-contrast grating comprises parallel bars of material having a high index of refraction surrounded by a material having a low index of refraction. At least one embodiment of the invention is configured with the high-contrast grating comprising curving grating elements (bars) of material having a high index of refraction and surrounded by a material having a low index of refraction. At least one embodiment of the invention is configured with the high-contrast grating comprising concentric circular grating elements (bars) of material having a high index of refraction and surrounded by a material having a low index of refraction.

At least one embodiment of the invention is configured with a "chirped" high-contrast grating in which the grating period varies along a distribution direction of the grating elements (e.g., perpendicular to the length of the grating bar) to provide varying phase changes to focus the reflection and/or transmission. At least one embodiment of the invention is configured so that the width of the grating elements (bars) varies along the length of one or more grating elements (bars) to focus the reflection and/or transmission.

At least one embodiment of the invention is configured so that the high-contrast grating focuses optical energy from a normally incident wave. Embodiments of the invention are configured so that the high-contrast grating is configured for receiving optical energy in a Transverse-Magnetic (TM) polarization, or in a Transverse-Electric (TE) polarization. At least one embodiment of the invention is configured so that the width and position of each grating element (bar) of the high contrast grating is selected in response to selecting a straight or curved line path along a phase contour map which encompasses a total phase shift of at least $2\pi$ and which only traverses regions of high reflectivity within the graph. At least one embodiment of the invention is configured so that the width and position of each grating element (bar) of the high contrast grating is further determined in response to a bar-by-bar optimization process in which the dimensions of each grating element (bar) is adjusted to minimize energy leakage to the transmission side. In at least one embodiment of the invention, the high-contrast grating provides double focusing with both the reflected and transmitted waves being focused.

The thickness ($t_g$) of the grating elements (bars) determines phase accumulated by its multiple modes, and thereby controls their interference and the phase of transmission and reflectance. Three physical parameters largely control reflectivity of the high-contrast gratings, including period ($\Lambda$), thickness ($t_g$), and duty cycle ($\eta$), and in which the duty cycle is defined as a ratio between width of the high index material (s) to its period ($\Lambda$).

One embodiment of the invention is an apparatus for focusing optical energy, comprising: (a) a high-contrast grating (HCG) having grating elements (bars) spaced apart from one another, in which the high-contrast grating elements having subwavelength dimensions and an index of refraction at or exceeding approximately three, and the high-contrast grating elements having thickness ($t_g$) which determine phase accumulated by multiple modes of the high-contrast grating which controls interference of the modes and phases of transmission and reflectance; (b) a low index of refraction material, or materials, surrounding the grating elements; (c) wherein the grating is planar and configured to receive an incident wave which excited multiple modes within the high-contrast grating and is focused for reflection and/or transmission by the high contrast grating; (d) grating element width and spacing varies to focus the reflection and/or transmission to a desired location in relation to the grating; (e) wherein the high contrast grating is chirped in response to varying grating period along a distribution direction of the high-contrast grating elements to provide varying phase changes along a length of the high-contrast grating to focus the reflection and/or transmission; and (f) wherein the high-contrast grating device is configured to provide double focusing with both the reflected and transmitted waves being focused.

One embodiment of the invention is a monolithic vertical cavity surface emitting laser (VCSEL), comprising: (a) a top output mirror having a high-contrast grating (HCG) with grating elements of subwavelength spacing and width from a material having a high index of refraction, such as exceeding approximately three; (b) a first layer of low index of refraction material surrounding and adjacent to the grating elements; (c) a second layer of low index of refraction material adjacent to the first layer of low index material; (d) wherein said first and second layer of low index material preferably has a refractive index of approximately one to 1.8 and comprises one or more materials; (e) an active region having optical active region (e.g., quantum structures, such as quantum wells, wires or dots) disposed between the first and the second low index of refraction material; (f) wherein the grating elements of the first mirror and the second mirror are configured of varying width along their length and/or distribution direction to provide a lensing effect; (g) a bottom mirror.

At least one embodiment of the invention is configured with the bottom mirror comprising a distributed Bragg reflector (DBR). At least one embodiment of the invention is configured with the bottom mirror comprising a planar non-focusing HCG. At least one embodiment of the invention is further configured with the bottom mirror positioned beneath the second layer of low index material comprising a high-contrast grating (HCG) with grating elements of subwavelength dimensions from a material having an index of refraction at or exceeding approximately 2, more preferably 2.5, and most preferably at or above 3; (h) wherein the lensing effect from the high-contrast gratings of the top mirror and the bottom mirror focus the optical mode within a confocal cavity onto the optical active region (e.g., layer of quantum structures); and (i) wherein the high-contrast grating of the top mirror is configured to provide double focusing with both the reflected and transmitted waves being focused.

At least one embodiment of the invention is configured with the grating elements being periodically spaced. At least one embodiment of the invention is configured with the spacing and/or width of the grating elements varying along the length or width of grating element distribution to provide a lensing effect.

At least one embodiment of the invention is configured with a top mirror utilizing HCG lensing, while the bottom mirror is conventionally implemented, such as with a DBR mirror and lens. At least one embodiment of the invention is configured with the bottom mirror utilizing HCG lensing, while the top mirror is conventionally implemented, such as with a DBR mirror and lens.

The present invention provides a number of beneficial elements which can be implemented either separately or in any desired combination without departing from the present teachings.

An element of the invention are lenses and reflectors comprising focusing high-contrast gratings having grating element (bar) width and spacing variations in at least one dimension to focus transmitted and/or reflected optical energy.

Another element of the invention lenses using high contrast gratings in which the grating bars comprise parallel straight, curving or circular segments of high index material surrounded by low refractive index materials.

Another element of the invention is the ability of choosing phase output independently from amplitude.

Another element of the invention is the ability to focus optical energy received from a normally incident wave, or at varying angles.

Another element of the invention is an optimization process in which the width and position of grating bars of said high contrast grating are determined in response to selecting a straight or curved line path along a phase contour map which encompasses a total phase shift of at least $2\pi$ and which only traverses regions of high reflectivity.

Another element of the invention is an optimization process in which the width and position of grating bars of said high contrast grating are further determined using a bar-by-bar optimization process in which the dimensions of each bar were adjusted to minimize energy leakage.

Another element of the invention allows the focusing HCG gratings to provide double focusing with both the reflected and transmitted waves being focused.

A still further element of the invention is the incorporation of the focusing HCG gratings during device fabrication, such as within a vertical cavity surface emitting laser (VCSEL).

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 7A through FIG. 7E are intensity profiles showing convergence as a function of the number of modes.

FIG. 10A through FIG. 10C are graphs of reflectivity spectrum and normalized impedance encountered by the incident plane wave.

DETAILED DESCRIPTION OF THE INVENTION

1. Theoretical Analysis of Grating Reflectivity

The following sections provide an analysis of grating reflectivity that will aid in understanding the techniques and embodiments of the present invention. For the sake of simplicity the analysis is limited to the case of surface-normal incidence and a rectangular profile of refractive index, although the inventive aspects are not limited in this regard.

Figure 1:
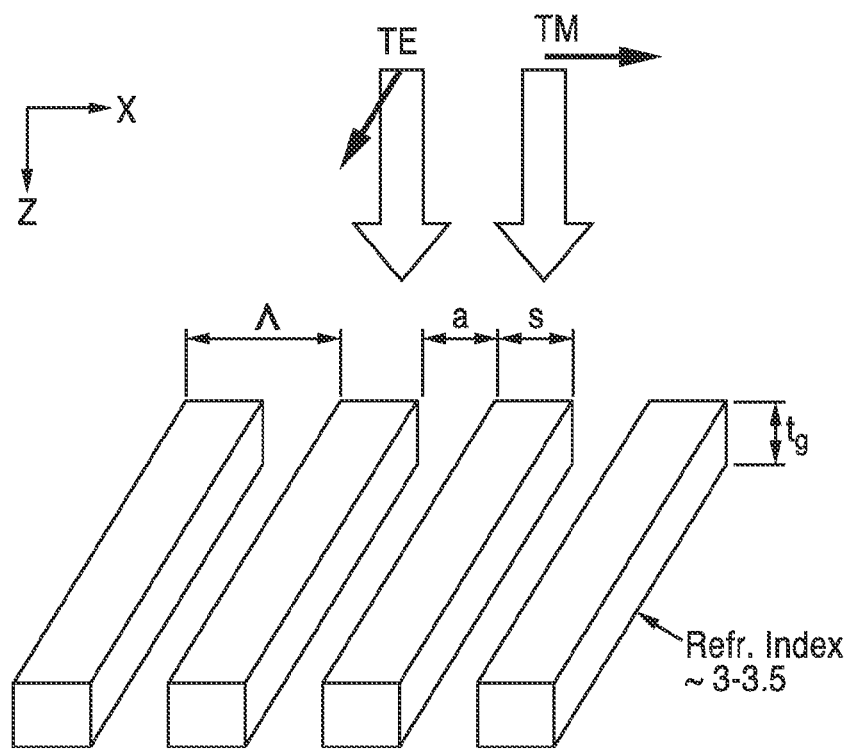
FIG. 1 is a schematic of a high-contrast grating, showing incident optical waves in two different polarizations.

FIG. 1 depicts geometry for a High Contrast Grating (HCG), shown with upper outline arrows indicating the wave incidence direction, and from which the medium size arrows are shown in relation thereto representing E-field direction illustrating both Transverse-Magnetic (TM) and Transverse Electric (TE) polarizations. The period ($\Lambda$) of the gratings is shown in the figure, along with bar width (s), thickness ($t_g$), and air-gap (a).

The parallel bars represent a dielectric material with a refractive index ($\eta_r$), which is significantly higher than the refractive index of the surrounding medium, wherefrom the phrase arises "High Contrast" Grating. The typical refractive index of the high-index grating bars is 3~3.5, and the outside medium is assumed to be a low refractive material or air ($\eta_r$=1). It should be appreciated that numerous low index media exist (e.g., oxides), which provide comparable effects and refractive indices which are less than two (2), and more preferably approximately one (1). The grating periodicity direction is depicted as x, with the incident plane wave propagation direction depicted as z indicated by the large upper arrows. For simplicity, the length of each grating bar is assumed to be infinite in y direction (coming out of the page) and infinitely periodic in x direction.

Two polarizations are considered in the analysis: (i) Transverse-Magnetic (TM), in which the electric field is in the x direction; (ii) Transverse Electric (TE), in which the electric field is in y direction. Both polarizations are represented in the figure which are labeled and superposed over the wave incidence direction.

Figure 2:
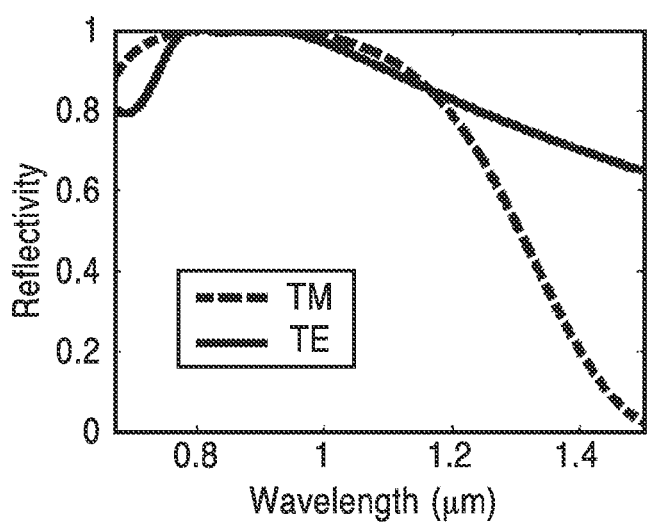
FIG. 2 is a graph of reflectivity as a function of wavelength for the two polarization directions.

FIG. 2 depicts an example of the broad-band high reflectivity provided by the HCG structure for both polarizations. By way of example, the parameters for TM polarization for this specific embodiment are: $\eta_r$=3.21, $\Lambda$=0.44 µm, s/$\Lambda$=0.77, $t_g$=0.29 µm. The parameters for use with a specific embodiment having TE polarization are: $\eta_r$=3.3, $\Lambda$=0.64 µm, s/$\Lambda$=0.38, $t_g$=0.14 µm.

Figure 3:
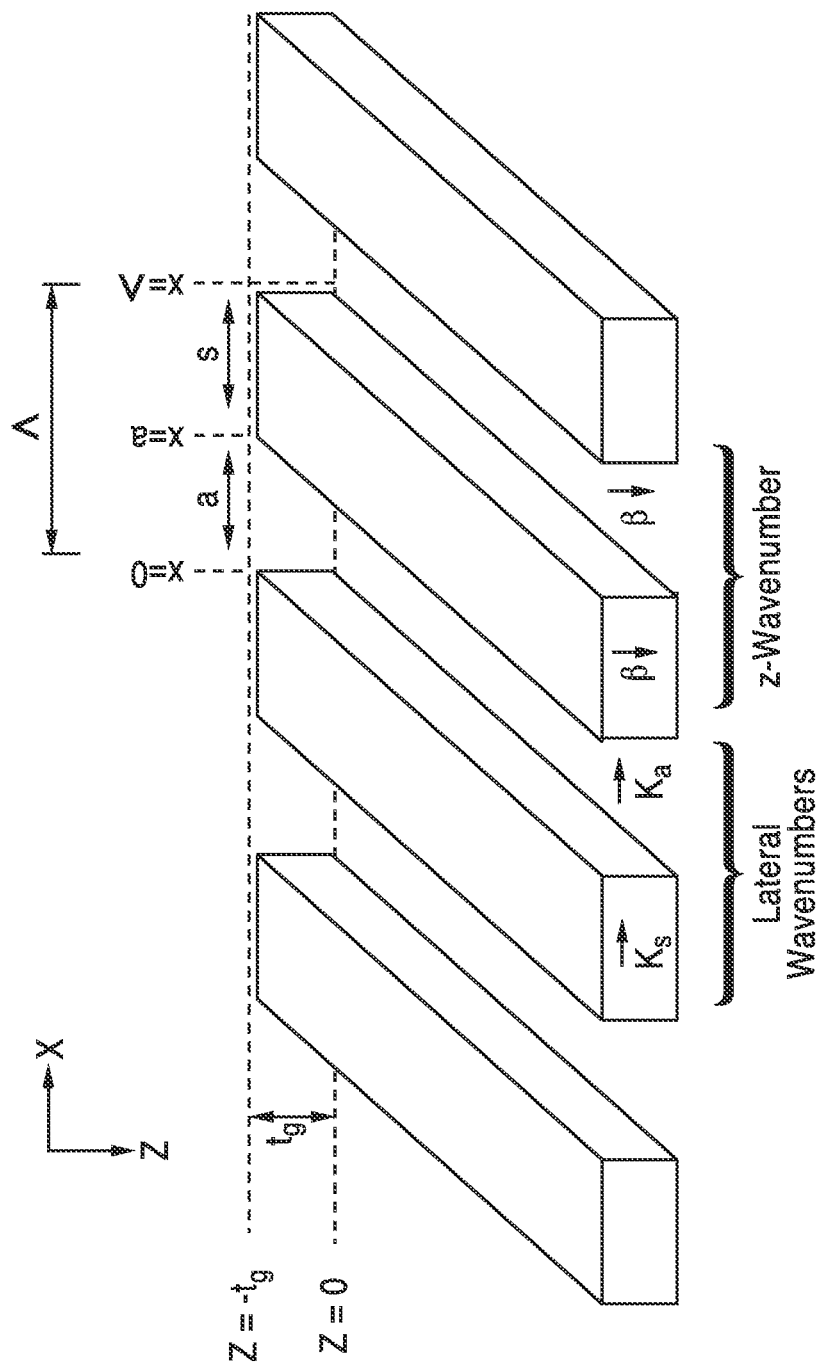
FIG. 3 is a schematic of a high-contrast grating, showing lateral and z wavenumbers in relation to grating dimensions.
Figure 4:
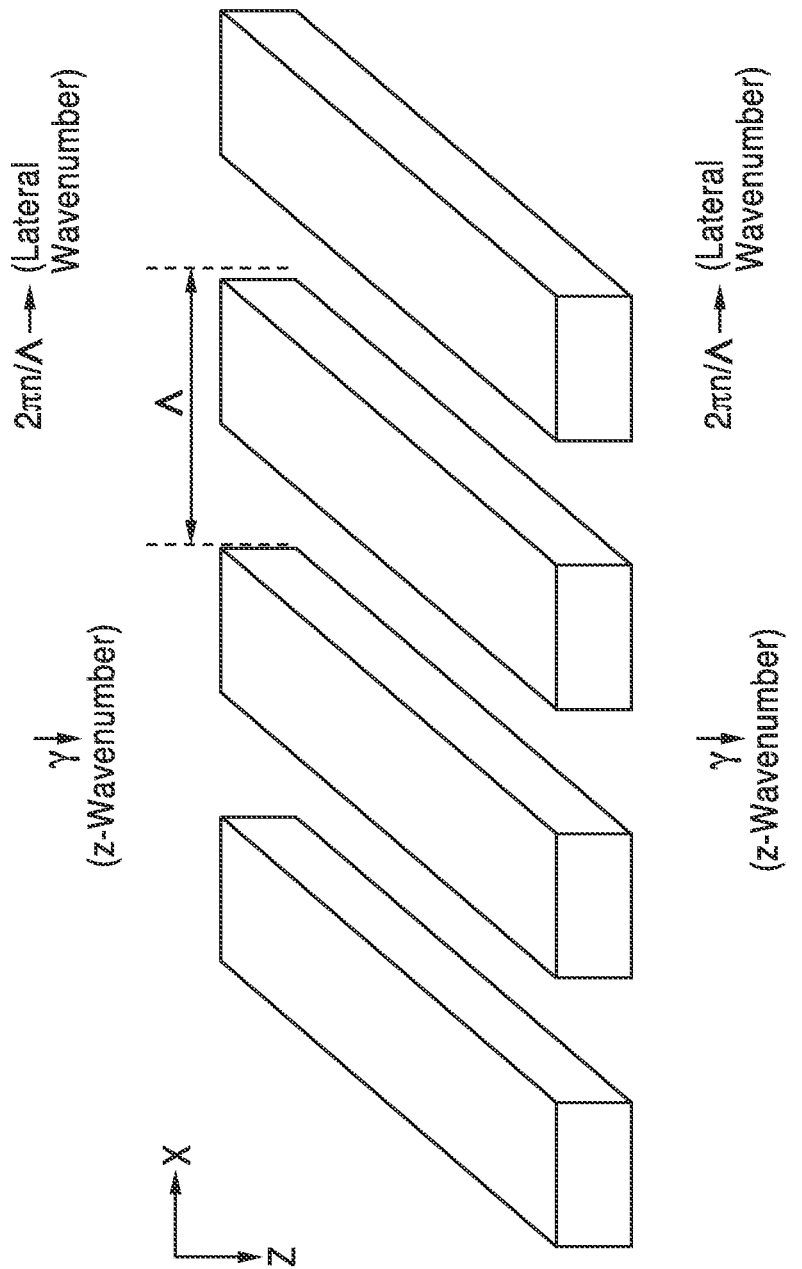
FIG. 4 is a schematic of a high-contrast grating, showing lateral and wavenumbers in relation to grating period.

FIG. 3 and FIG. 4 depict gratings with reference indicia describing the nomenclature for all wavenumbers, axes and dimensions, and referring to mode formulations both inside and outside of the high-contrast grating (HCG). Lateral and z-wavenumbers are seen depicted in the figures along with period, grating thickness and other parameters.

Upon wave incidence, reflected and transmitted modes are generated at the grating, the lowest of which are plane waves. These elements are described in Table 1, at the end of the specification, along with their associated mathematical formulations. The mode profiles in Eq. 1 and Eq. 2 of Table 1 describe the lateral (x) field components: electric field $E_x$ in the TM case, and magnetic field $H_x$ in the TE case. The formulation of the y and z field components are not described herein, as they can be readily derived from the x components. Since the HCG is considered infinite in y direction and the incidence is surface normal, the solution described in Table 1 is two-dimensional ($\delta/\delta y$). In addition, the solution is described for only one HCG period ($0<x<\Lambda$), since all modes are periodic in x direction. As the plane wave incidence is surface normal, there is no preferred direction among +x and −x, wherefore modes in Eqs. 1, 2, 4 and 5, have a standing wave (cosine) lateral profile. Eq. 1 and Eq. 2 show that the mode profiles have two sets of symmetry planes: each air-gap center (x=a/2) and each grating bar center (x=a+s/2). The same is of course true for the modes outside HCG, seen in Eq. 4 and Eq. 5. While the symmetry plane (x=a/2) outside HCG is obvious from Eq. 4 and Eq. 5, the following identity helps to demonstrate that (x=a+s/2) is a symmetry plane as well:

$$\cos[2\pi n(x-a/2)/\Lambda] = (-1)^n \cos\{2\pi n[x-(a+s/2)]/\Lambda\}.$$

The lateral symmetry in Eq. 1 and Eq. 2 and Eq. 4 and Eq. 5 is even (cosine) rather than odd (sine), because the incident plane wave has a laterally constant profile, and thus it can only excite cosine harmonics.

In Eq. 6 through Eq. 9 of Table 1 and Table 2 the dispersion relations are listed between the different wave numbers, while Eq. 9 describes the x-wavenumbers outside the grating ($\gamma_n$). Eq. 9 shows that the HCG, as expected, has only the zeroeth diffraction order: $\gamma_0 = 2\pi/\lambda$, while all higher orders are evanescent ($\gamma_n$ is imaginary), since HCG is subwavelength ($\Lambda/\lambda<1$). This fact is essential for the design of high reflectivity gratings, since high reflectivity is achieved by cancelling the zeroeth-transmissive order. It should be appreciated that higher evanescent orders do not carry power and thus do not require cancellation. Had there been more than one transmissive order, it would not be possible to obtain a high reflectivity grating.

Figure 5:
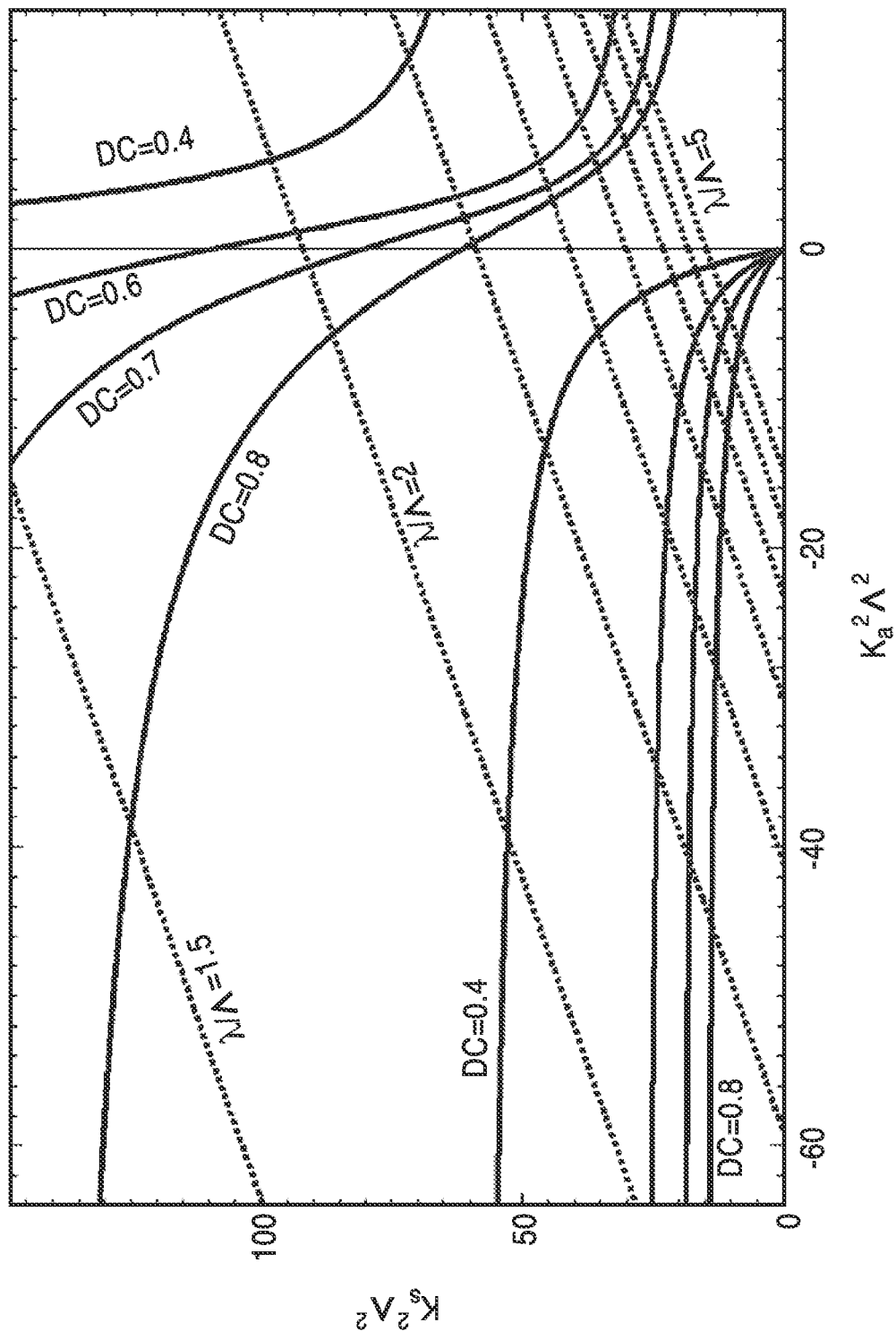
FIG. 5 is a graph of dispersion for an HCG with a given refractive index.

FIG. 5 depicts the dispersion relations for Eq. 6 through Eq. 8 in Table 1 for various grating duty cycles (DC), defined as DC=s/$\Lambda$, shown as DC=0.4, 0.5, 0.6, 0.7 and 0.8. These dispersion relations are shown for an HCG with a refractive index $n_r$=3.21, assuming TM polarization. Lower and upper curves represent the first two branches of Eq. 8. The intersection between the linear lines and the transcendental curves denote the x-wavenumbers of each mode. The linear lines in the figure correspond to subtracting Eq. 7 from Eq. 6. It will be seen that at large wavelengths ($\lambda \gg \Lambda$) the lowest harmonic resembles a plane wave $k_s \approx k_a \approx 0$, since at large wavelengths the exact grating profile loses effect, and the grating behaves as a uniform layer with an effective refractive index.

The figure shows that inside the grating bars all modes have real wavenumbers $k_s$, while inside the air-gaps the lowest mode has an imaginary wavenumber $k_a$ and the higher modes have either imaginary or real $k_a$, depending on wavelength. Another intuitive observation from FIG. 5 is that at large wavelengths ($\lambda \gg \Lambda$) the lowest harmonic resembles a plane wave ($k_s \approx k_a \approx 0$), since at large wavelengths the exact grating profile loses effect, and the grating behaves as a uniform layer with an effective refractive index.

Based on the mode profiles of Table 1, the calculation of the HCG reflectivity is shown in Table 2. The method adopted in Table 2 borrows the reflection coefficient calculations of transmission lines, with the significant difference that in the multi-mode case of HCG, matrices replace scalars. The solution in Table 2 depends entirely on overlaps between mode profiles inside the HCG (Eq. 1 and Eq. 2) and those outside the HCG (Eq. 3 through Eq. 5). Initially, two unit-less matrices are defined: the E and H matrices respectively indicate the overlaps between the electric field profiles inside and outside HCG and the magnetic field profiles. This definition of E and H is insightful, since the entire HCG solution can be based on those two matrices.

As a second step, an intuitive expression is used in Eq. 12 to calculate the reflection matrix $\rho$, which describes the bouncing of the HCG modes from the HCG output planes (i.e., $z=0$ and $z=-t_g$) back into the grating. This reflection matrix is typically non-diagonal, which means that the modes couple into each other during the back-bouncing. This does not contradict the orthogonality of the modes inside HCG, since the back-bouncing involves interaction with the modes outside HCG, which are not orthogonal to the modes inside the HCG.

In regular transmission lines, the reflectivity calculation is also based on the accumulated phase, which is represented herein by the phase matrix $\phi$, defined in Eq. 13, as a diagonal matrix comprising individual phases of each mode. Having defined the reflection and the phase matrices, which are the matrix analogies of the corresponding scalars in transmission line theory, the transmission line solution steps are followed to define the (normalized) entrance impedance matrix of the HCG, $Z_{in}$, as shown in Eq. 14. Then by knowing $Z_{in}$, the reflectivity matrix R of the HCG is calculated by Eq. 15, whereby the coefficient of interest is $R_{00}$, which is the reflectivity of the incident plane-wave.

Figure 6:
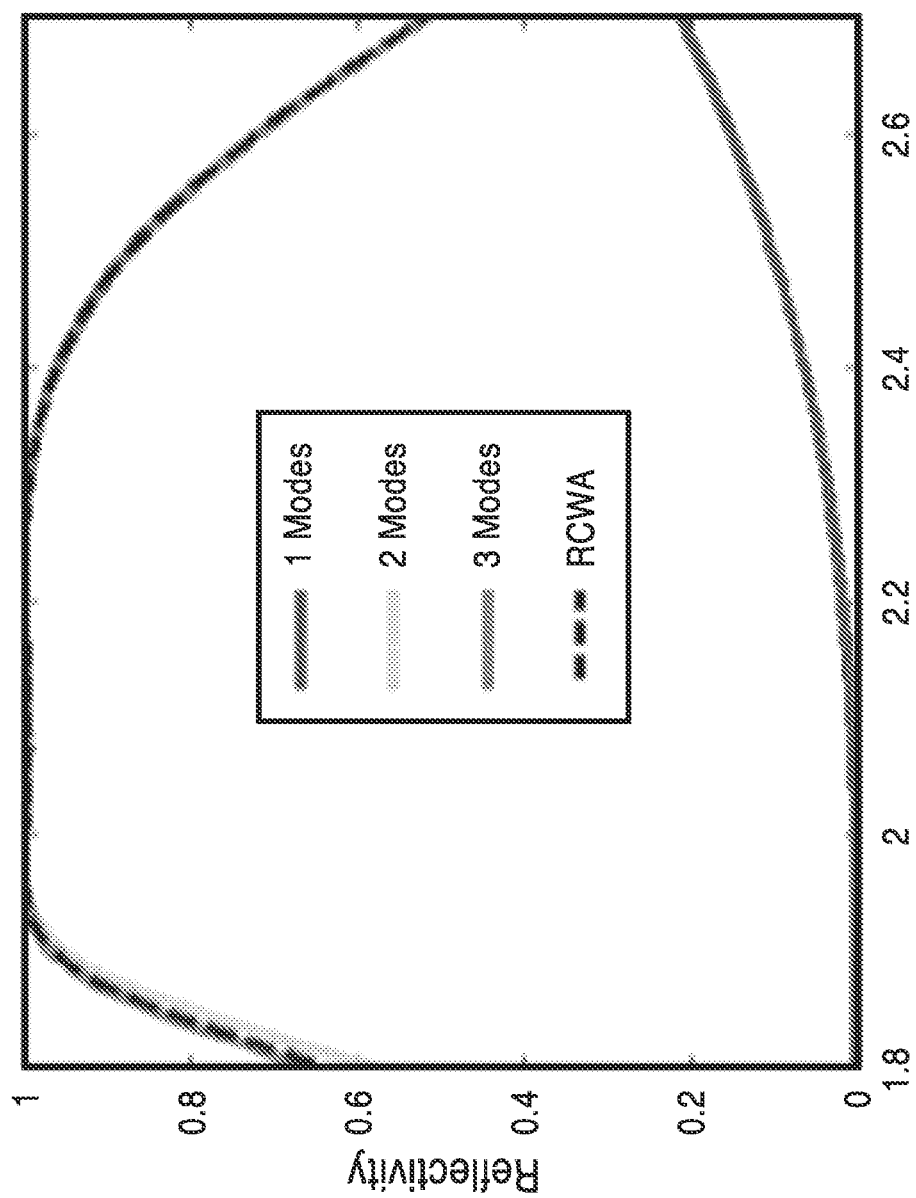
FIG. 6 is a graph of convergence of the analytical solution found in Tables 1 and 2 towards the RCWA simulation.
Figure 8B:
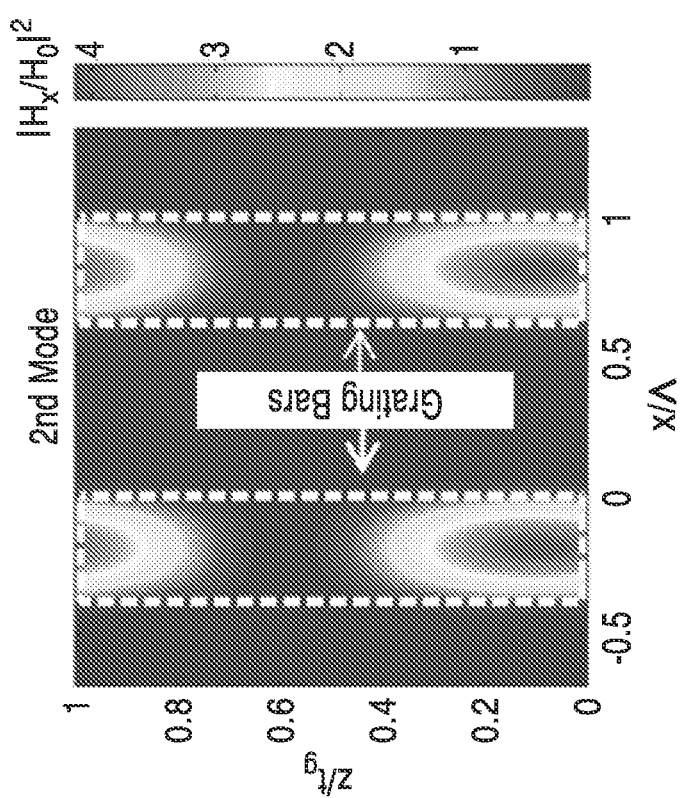
FIG. 8A through FIG. 8D are contour plots of modes within the HCG.
Figure 8A:
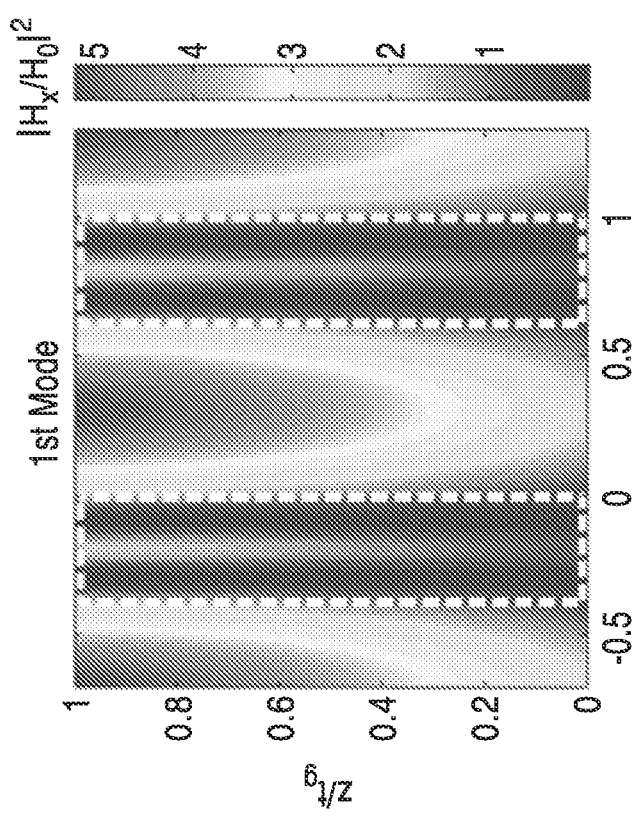
Figure 8D:
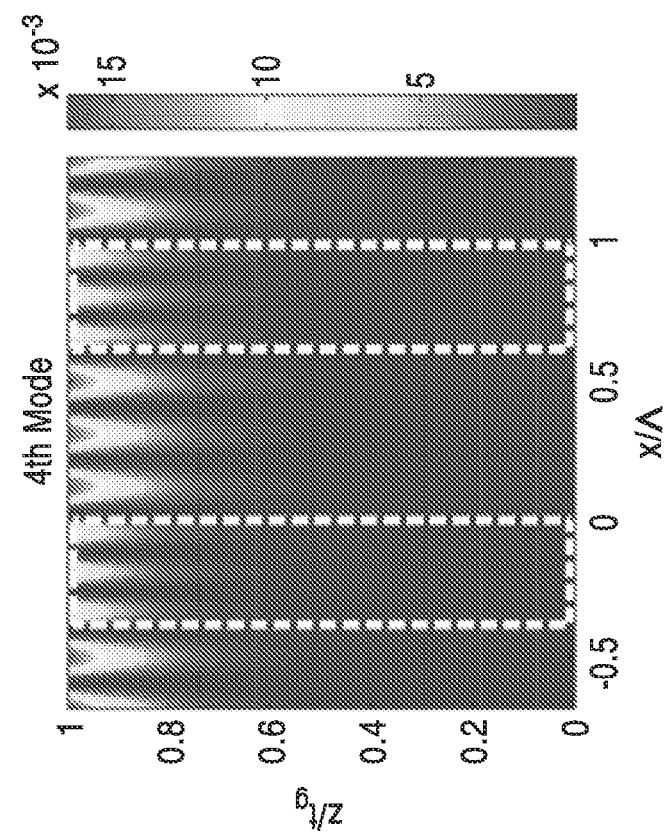
Figure 8C:
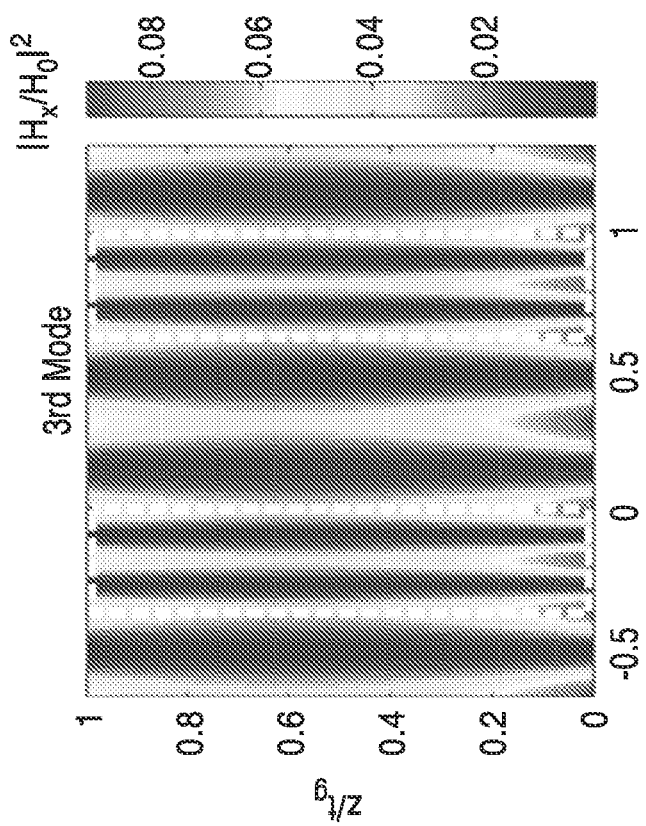

FIG. 6 depicts convergence of the analytical solution in Table 1 and Table 2 towards the Rigorous Coupled Wave Analysis (RCWA) simulation result as a function of the number of modes taken into consideration for TE polarization. Due to the inherent multimode nature of the HCG, the single mode solution is far from the RCWA result, but as soon as at least one more mode is added, the convergence becomes almost perfect as seen in the figure.

The next step is to determine how many modes in Table 1 and Table 2 are actually required to obtain the desired precision, in particular the rate at which the solution converges. A clear conclusion from FIG. 6 is that the two lowest modes are already sufficient to describe reflectivity with very high precision. However, a solution based on only one mode generates a result, which has nothing in common with the final solution. This agrees with the underlying principle of this work, which is the multi-mode nature of the HCG. A further examination of solution convergence is described below.

FIG. 7A through FIG. 7E depict convergence with respect to intensity profiles provided by the solution in Table 1 and Table 2 which are shown as a function of the number of modes taken into consideration. The grating bars are marked by the white dashed squares. When four or more modes are utilized, the boundary condition matching is almost perfect. The high reflectivity is clearly demonstrated by the standing wave profile created by the incident and reflected plane waves above the HCG. It will be seen in the figures that accuracy increases in response to increasing the number of modes taken into account from one in FIG. 7A to five in FIG. 7E. A single mode solution, as expected, is not enough to satisfy the boundary conditions at the HCG output planes ($z=t_g$ and $z=0$), while a two mode solution is already comes close to the final result. However, while a two mode solution is sufficient in terms of reflectivity, as shown in FIG. 6, it is still lacks precision in regards to its boundary condition matching, as seen in FIG. 7A through FIG. 7E, which requires four modes.

FIG. 8A through FIG. 8D depict separate contour plots for each mode inside the HCG, whose grating bars are marked by white dashed squares. The first mode is shown to exist principally in the air-gaps, while the second mode has a comparable intensity and is shown mainly within the area of the grating bars. The third mode is a surface wave, evanescently decaying into the grating with an intensity approximately fifty (50) times smaller than the first two modes.

1.1 Two-Port Circuit Analogy.

The immediate benefit of the transmission line formulation described in Table 1 and Table 2 is that the reflectivity phenomena discussed above can be approached in terms of widely used transmission-line impedance terminology, with the significant difference that the impedance according to the present invention is a matrix. In microwave theory, circuits described by matrix impedances are called multi-port circuits. The present invention extends an analogy between the multiple modes excited by the incident plane wave to a multiple-port circuit, characterized by an impedance matrix $Z_{in}$, given in Eq. 14, such that each mode corresponds to a circuit port. The prevalence of the first two modes, demonstrated in FIG. 6, makes it reasonable to limit the discussion to a two-port circuit and analyze its 100% reflectivity condition.

Figure 9:
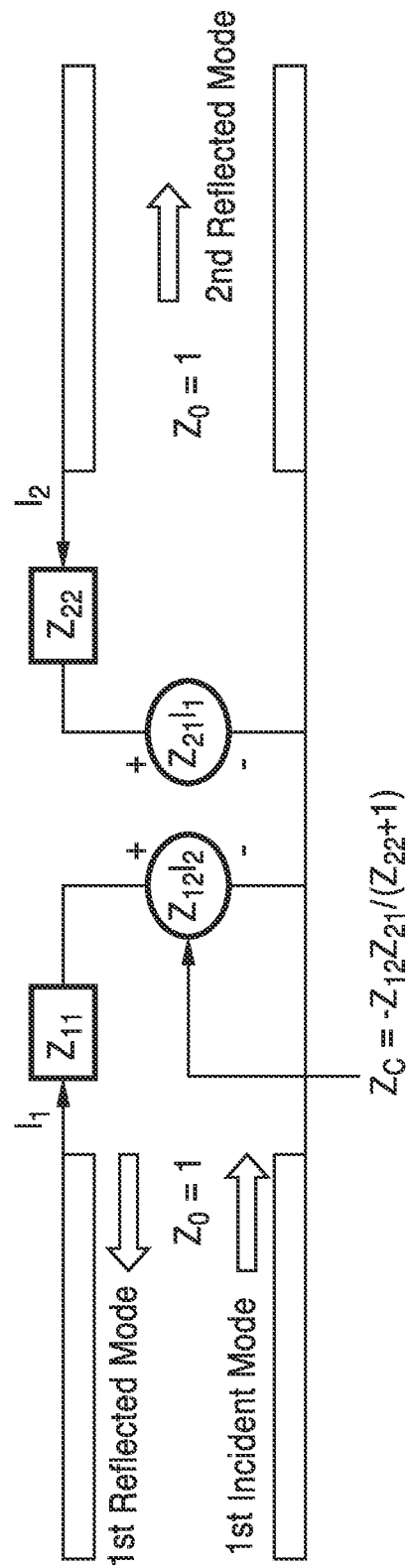
FIG. 9 is a schematic of a two-port circuit analogy which can be applied to reflectivity phenomena according to the invention.

FIG. 9 illustrates a two port circuit analogy for the HCG which is represented by perhaps the best known model for a two-port circuit. When the real part of $Z_C$ cancels-out the real part of $Z_{11}$, then 100% reflection is obtained as per Eq. 16 below.

The incident and reflected modes occurring at the left side transmission line shown in the figure, are an analogy to the plane wave, being incident and reflected from the HCG. The transmission line shown on the right side is an analogy to the second mode reflected from the HCG, which is a surface bound mode. In this analogy, the portion of the plane wave transmitted through the HCG is considered lost, and this loss is represented by a voltage drop associated with the real part of the impedance $Z_{11}$, while $Z_{22}$ plays the same role with regards to the second reflected mode. The HCG itself in this analogy is regarded as a coupling device between the first mode (plane wave) and the second mode, and is therefore represented by the two conditional voltage sources: $Z_{12}I_2$ represents the coupling from the second mode to the first and $Z_{21}I_1$ represents the coupling from the first mode to the second. Impedance $Z_C$ represents the coupling impedance from the second port into the first. Accordingly, the condition for full reflectivity of a two-port circuit is given by:

$$Re(Z_{11}) = -Re(Z_C) = Re[Z_{12}Z_{21}/(Z_{22}+1)] \quad (16)$$

When Eq. 16 is satisfied, the voltage drop associated with the real part of $Z_{11}$ is cancelled out by a voltage gain from the conditional source $Z_{12}I_2$, representing the feedback from the second port. In impedance terms, this entails the real part of $Z_{11}$ being cancelled out by the real part of $Z_C$. This means that the wave entering the first port encounters a non-resistive (purely reactive) impedance and is thus fully reflected. In the equivalent case of the HCG, when Eq. 16 is satisfied, the power carried by the plane wave does not leak through the grating. Instead, this power is being stored in the excited surface waves, which cannot carry the power out of the HCG and thus act as equivalent reactive elements. These surface waves couple the power back into the reflected plane wave, causing full reflection. This of course can never happen in a case of a uniform dielectric layer (grating with DC=100%), since it does not support surface waves upon plane wave incidence, and therefore the power cannot be stored and coupled back.

FIG. 10A through FIG. 10C depict reflectivity and impedance characteristics according to the inventive impedance analogy. In FIG. 10A a reflectivity spectrum is shown with the corresponding normalized input impedance, $Z_{in}=Z_{11}+Z_C$, encountered by the incident plane wave. The two high reflectivity peaks correspond to the two purely imaginary input impedances. The parameters are: TE polarization, $\eta_r=3.2$, DC=0.4, $t_g/\Lambda=0.222$.

The effective entrance impedance of the HCG, encountered by the incident plane wave is shown in the figure, along with the corresponding reflectivity spectrum. The set of figures illustrate that both reflectivity peaks correspond to entrance impedances which have no real part ($Re(Z_{in})=0$), which confirms that in the case of full reflection the HCG acts as an optical reactive element.

From the theory of Chebyshev filters it is known that when multiple spectral peaks are located in close vicinity of each other, a broadband spectrum is obtained. In addition, the spectral bandwidth of Chebyshev filters can be broadened at the expense of ripple. A similar phenomenon arises in the use of broadband HCGs, in which the number of proximal reflectivity peaks is typically two (or in rare configurations three). Designing a broadband HCG mirror relies on the fact that the HCG dimensions a, s, $\Lambda$, $t_g$, as seen in FIG. 1 and the wavelength $\lambda$, are all scalable, indicating that an HCG with dimensions (a, s, $\Lambda$, $t_g$) at wavelength $\lambda$, has the same reflectivity as an HCG with the dimensions (ca, cs, c$\Lambda$, c$t_g$) at wavelength c$\lambda$, with c being a positive constant. Using this filter analogy can greatly simplify HCG design, since the first steps can be performed in normalized units: $t_g/\Lambda$, $\lambda/\Lambda$ and DC=s/$\Lambda$, and then all the normalized dimensions can be scaled back according to the desired wavelength.

Figure 11A:
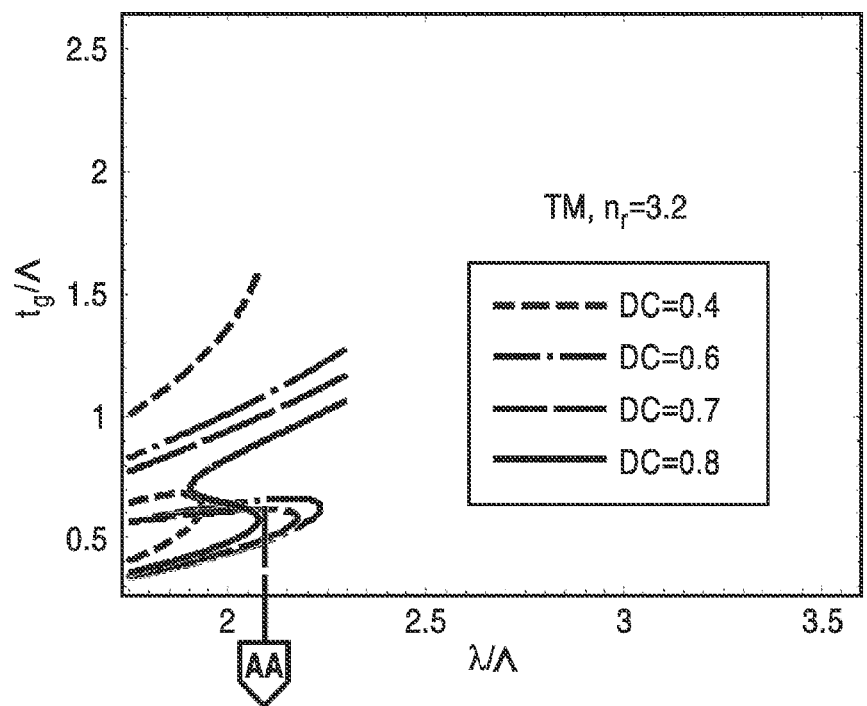
FIG. 11A through FIG. 11D are graphs of grating design parameters according to elements of the present invention.
Figure 11B:
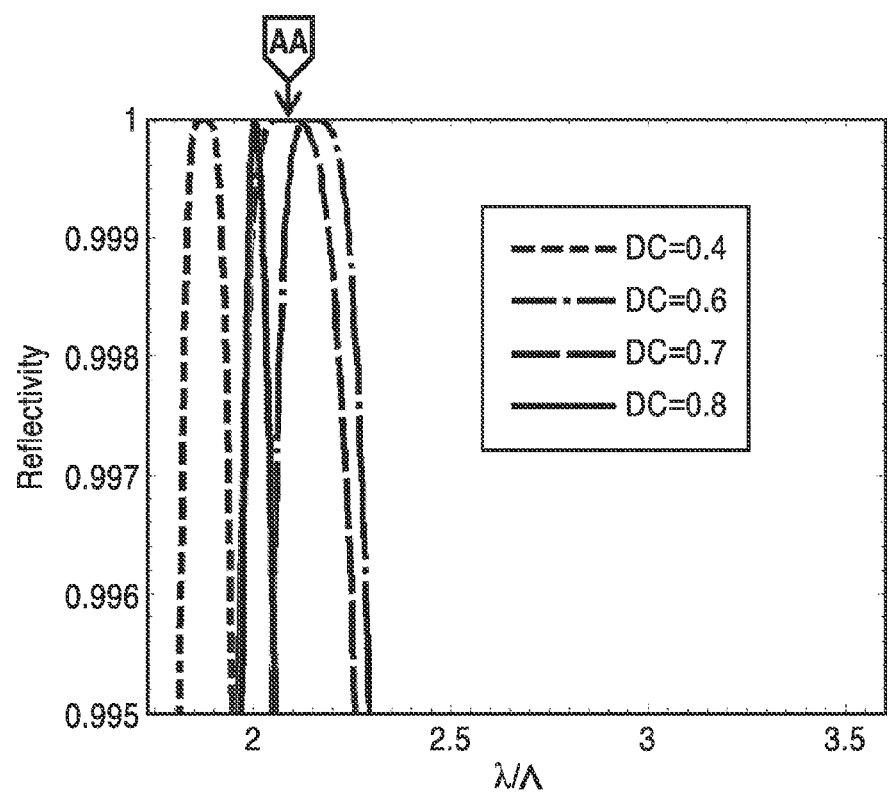
Figure 11C:
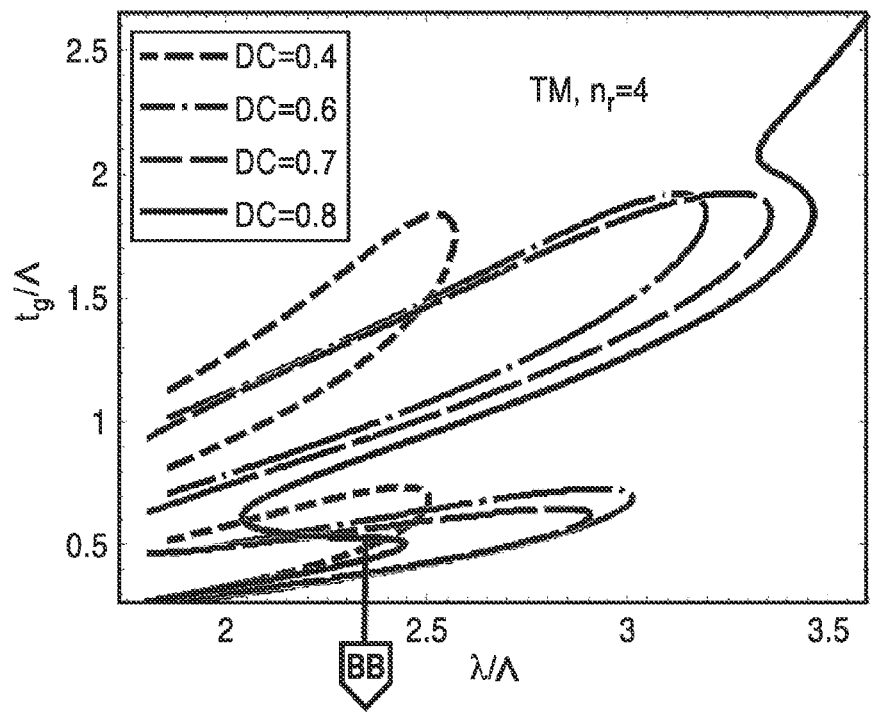
Figure 11D:
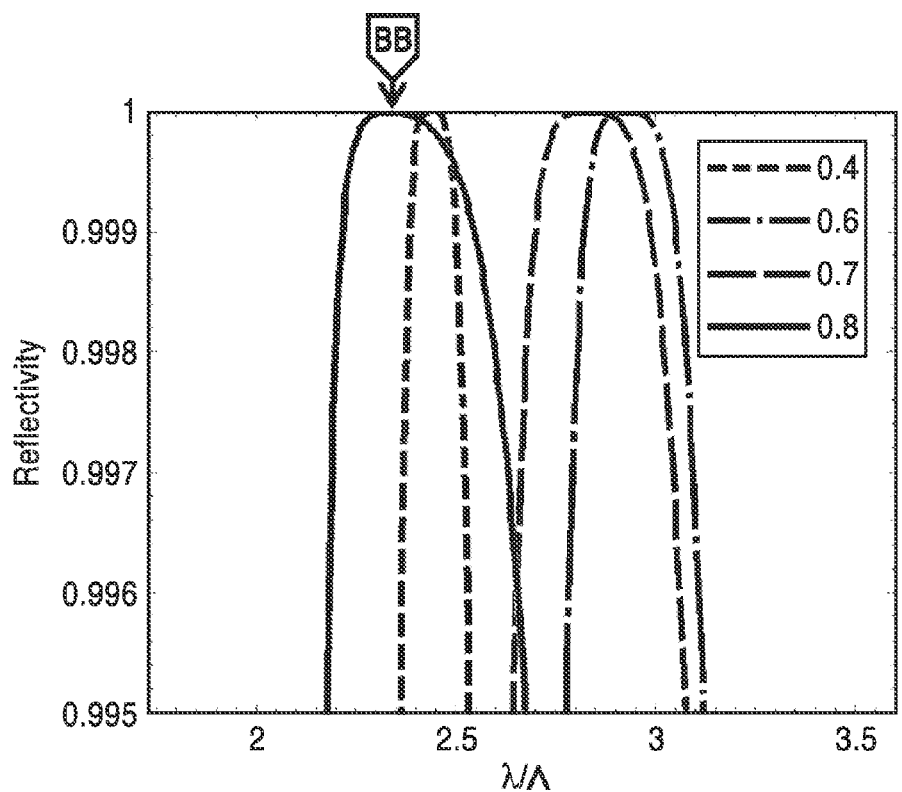

FIG. 11A and FIG. 11C illustrate plotting these optimal values of $t_g/\Lambda$ with respect to $\lambda/\Lambda$ for different duty cycles for two different refractive indices. The implementation of the filter analogy is as follows: (i) For each normalized wavelength $\lambda/\Lambda$, a discrete set of normalized thicknesses $t_g/\Lambda$ will generate 100% reflectivity by satisfying Eq. 16; (ii) Among all duty cycles in these curves the flattest region (broadest spectrum), corresponding to broad-band high reflectivity, is chosen as marked by the arrows shown from FIG. 11A and FIG. 11C, down to the reflectivity graphs of FIG. 11B and FIG. 11D. Higher refractive index contrast (right figures) leads to broader spectra. The middle of the flattest region corresponds to the optimal values of DC, $t_g/\Lambda$ and $\lambda/\Lambda$; (iii) Finally, according to the desired central wavelength $\lambda$, the normalized dimensions are rescaled.

Accordingly, FIG. 11A through FIG. 11D demonstrate implementation for two different refractive indices $\eta_r=3.2$ (FIG. 11A, FIG. 11B) and $\eta_r=4$ (FIG. 11C, FIG. 11D) and it reveals the intuitive conclusion, which is at the core of the motivation for using High Contrast Gratings, that when the refractive index contrast is higher ($\eta_r=4$), the achievable spectra are broader. In addition, when the refractive index contrast is higher, the range of grating geometries supporting high reflectivity becomes wider, as reflected in the differences seen between FIG. 11A compared with FIG. 11C. This is why high contrast gratings tend to provide large fabrication tolerances.

Figure 12:
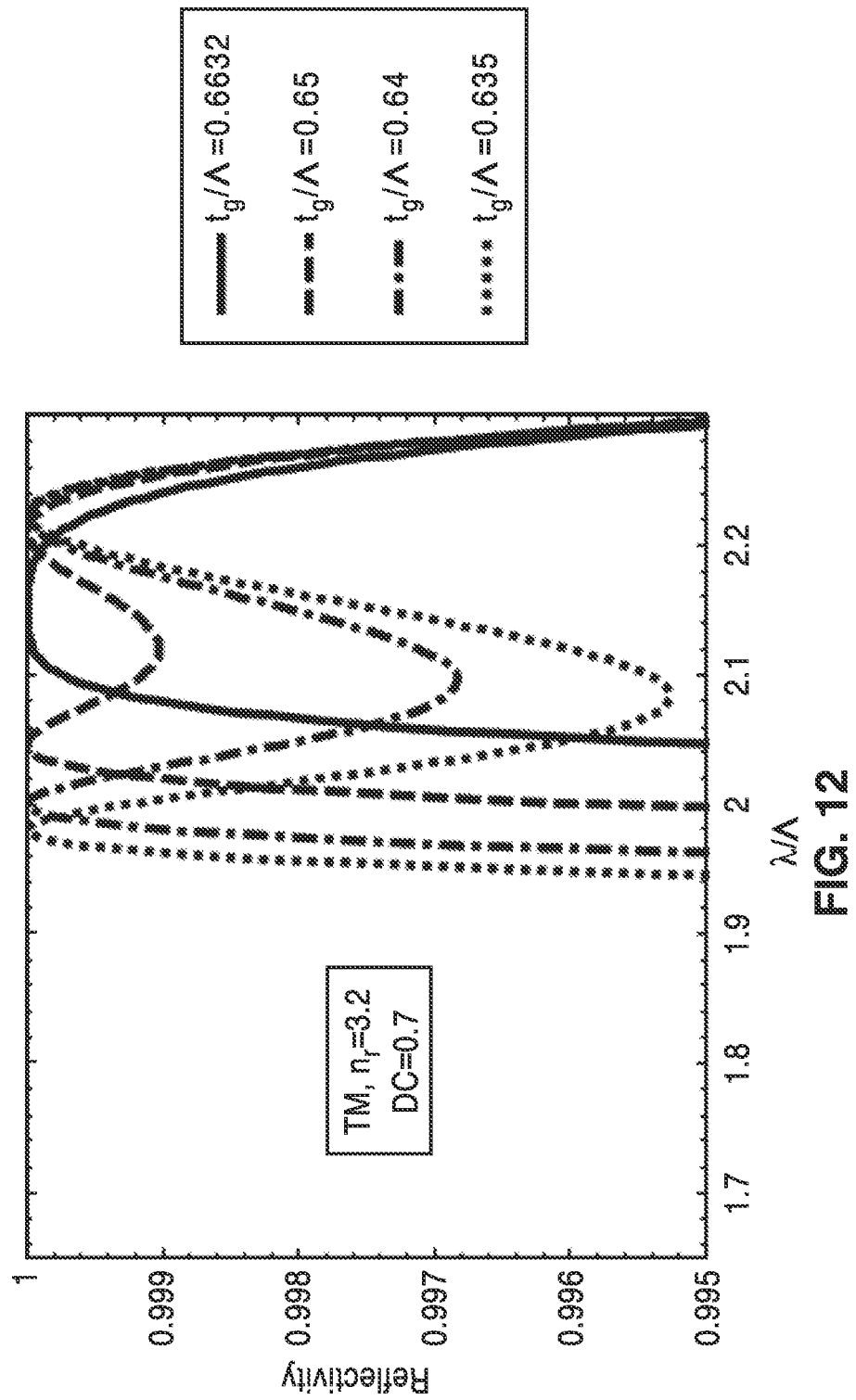
FIG. 12 is a graph of grating line width with respect to ripple found in the similar Chebyshev filter according to elements of the present invention.

FIG. 12 depicts tradeoffs of line width and ripple in a similar manner as used with Chebyshev filters; that is, once the broadband configuration is found, the reflectivity spectrum can be broadened even further by decreasing the grating thickness. In demonstrating the similarity to Chebyshev filters, it will be noted that a decrease in grating thickness will push the two overlapping peaks apart, further increasing the bandwidth at the expense of rippling the spectrum.

1.2 Destructive Interference at the Output Plane.

In addition to the transmission line formulation described above, the following offers an intuitive description for the phenomenon of 100% reflectivity in terms of wave interference.

First consider a reflection from a uniform dielectric layer. In order for the reflection to reach 100%, the transmission must be fully cancelled. In the case of surface normal incidence, zero transmission can only be obtained if the lateral (x,y) electric and magnetic field components inside the layer are zero at the back output plane (z=0). In the case of uniform dielectric layers, however, it is obvious that the electric and the magnetic fields cannot both have minima at the same z, since minima of one is always accompanied by maxima of the other. However, if it were possible to excite more than one mode within the uniform layer, the additional degree of freedom would have made it possible to design a geometry in which the multiple modes interfere with their reflected counterparts in a way that the overall E and H field components are both zero at z=0.

Unfortunately, in simple uniform dielectric layers multimode excitation does not occur under the condition of plane wave incidence. The alternative is to break the uniformity by introducing a grating. When a plane wave is incident upon a grating, multiple modes are excited within it, which introduces the necessary degree of freedom to achieve destructive interference at the back output plane. Since the grating modes are not laterally constant, instead of the overall field being zero, their average (with respect to x axis) is required to be zero, since it is the lateral average that determines whether or not there is a field overlap with the transmitted wave, and thus whether or not the transmitted wave can be excited.

Figure 13:
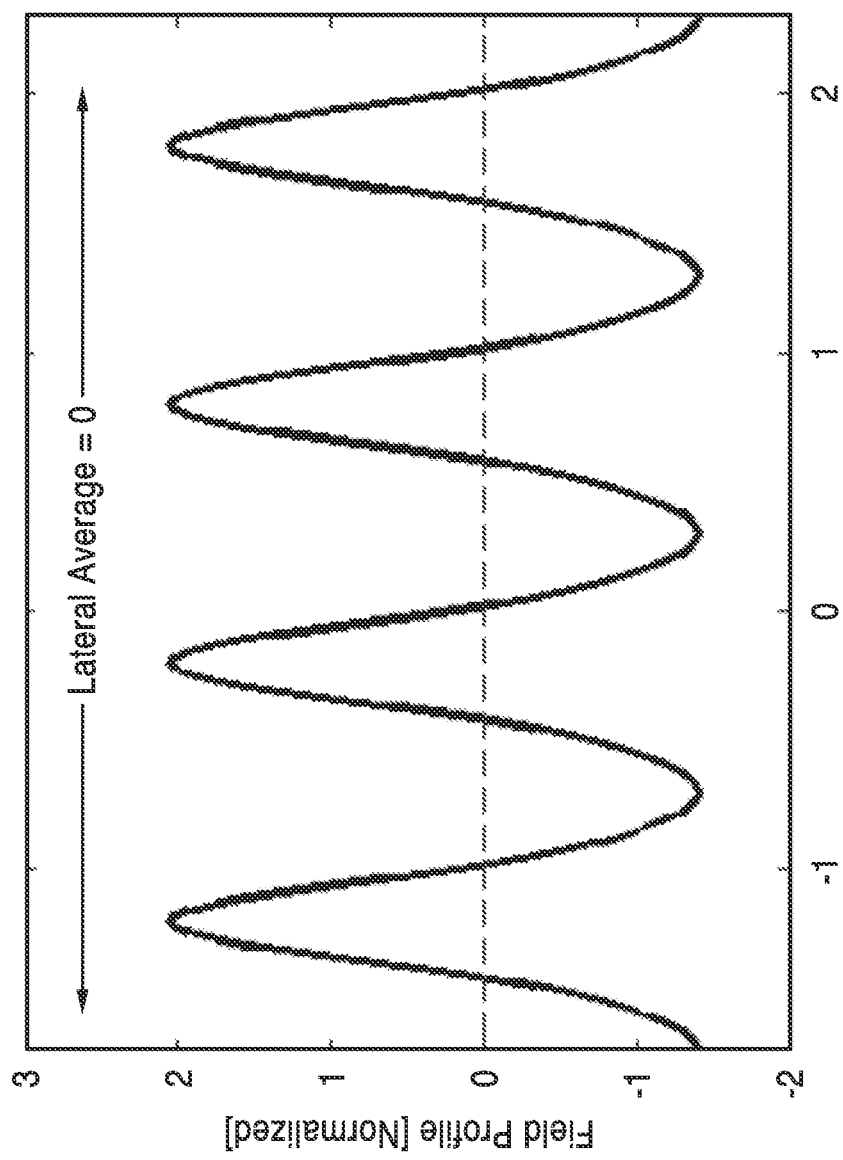
FIG. 13 is a graph of grating field profile with respect to period ($\lambda/\Lambda$).

FIG. 13 depicts a field profile at the bottom grating output plane (back output plane) of the HCG (z=0). The zero lateral average is an indicator for the perfect destructive interference, whereby the overall field profile, which combines all modes and their reflections, is zero on average.

2. Planar, High NA, Low-Loss Lenses Using Sub-Wavelength HCG

Figure 14:
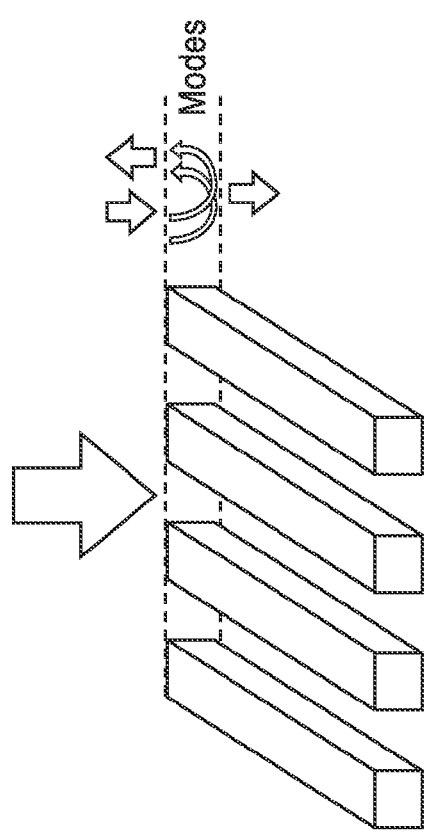
FIG. 14 is a schematic of a high-contrast grating (HCG) showing an incident wave exciting multiple modes.

FIG. 14 depicts the operation mechanisms of high contrast gratings, showing an incident wave, depicted as the largest downward pointing arrow, exciting multiple modes within the HCG, depicted as the small curving arrows on the right side portion of the figure, which propagate into the grating and bounce back up at the bottom output plane. The interference of these modes determines the reflectivity of the HCG. One or more materials having a low index of refraction are assumed to surround the grating bars (e.g., above, below and between the grating bars), as seen in this figure.

The incident wave excites multiple modes within the grating, with the first two modes being the most significant, because they are the ones that carry the power, while the higher modes typically take the form of evanescent surface-bound waves. The modes propagate into the grating, and bounce back up at the bottom output plane, as seen by the curving arrows on the right hand side. It is the interference between these modes, along with their reflections, which determine the reflectivity and the transmissivity of the HCG. The HCG thickness ($t_g$) determines the phases accumulated by the modes, and therefore controls their interference, which is why the thickness of the HCG is typically an important design parameter. The phases accumulated by the modes inside the HCG will also determine the phases of its reflectivity and transmissivity, on which the proposed implementation is based.

By way of example and not limitation, the implementations are depicted at 1550 nm, yet it will be appreciated that they are scalable to any desired wavelengths. The designs are shown carried out at normal incidence to the grating, however, the teachings herein can be generally applied to any incident angle without departing from the present invention.

Figure 15:
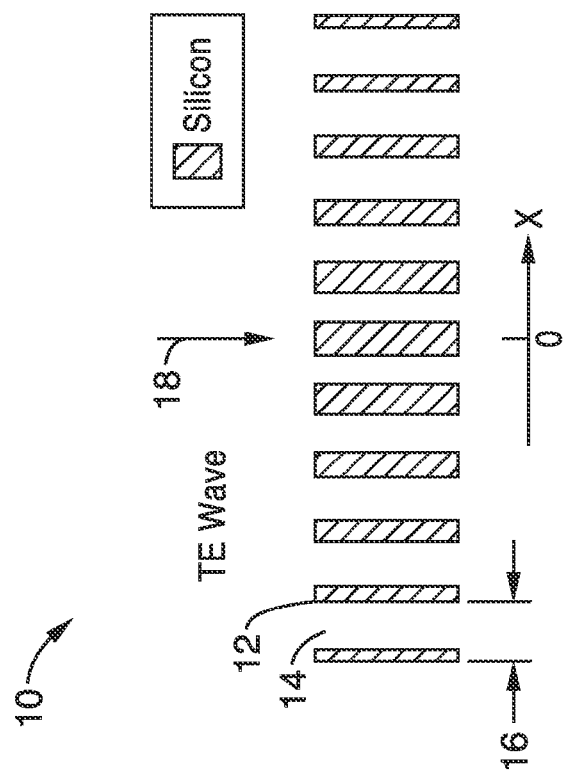
FIG. 15 is a schematic of an HCG lens configured for 1D lensing according to an element of the present invention.

FIG. 15 illustrates an example embodiment 10 of a one-dimensional (1D) HCG lens comprising a plurality of grating segments 12 (also referred to as grating elements or bars), with gaps 14, and period 16 between two adjacent grating segments. A plane wave 18, depicted by way of example with TE polarization, travels towards a chirped HCG having changes in period and duty cycle along one axis depicted as x. Due to the period and duty cycle change along the x axis, the plane wave has different additional phases at across direction x after passing through the HCG.

Figure 16:
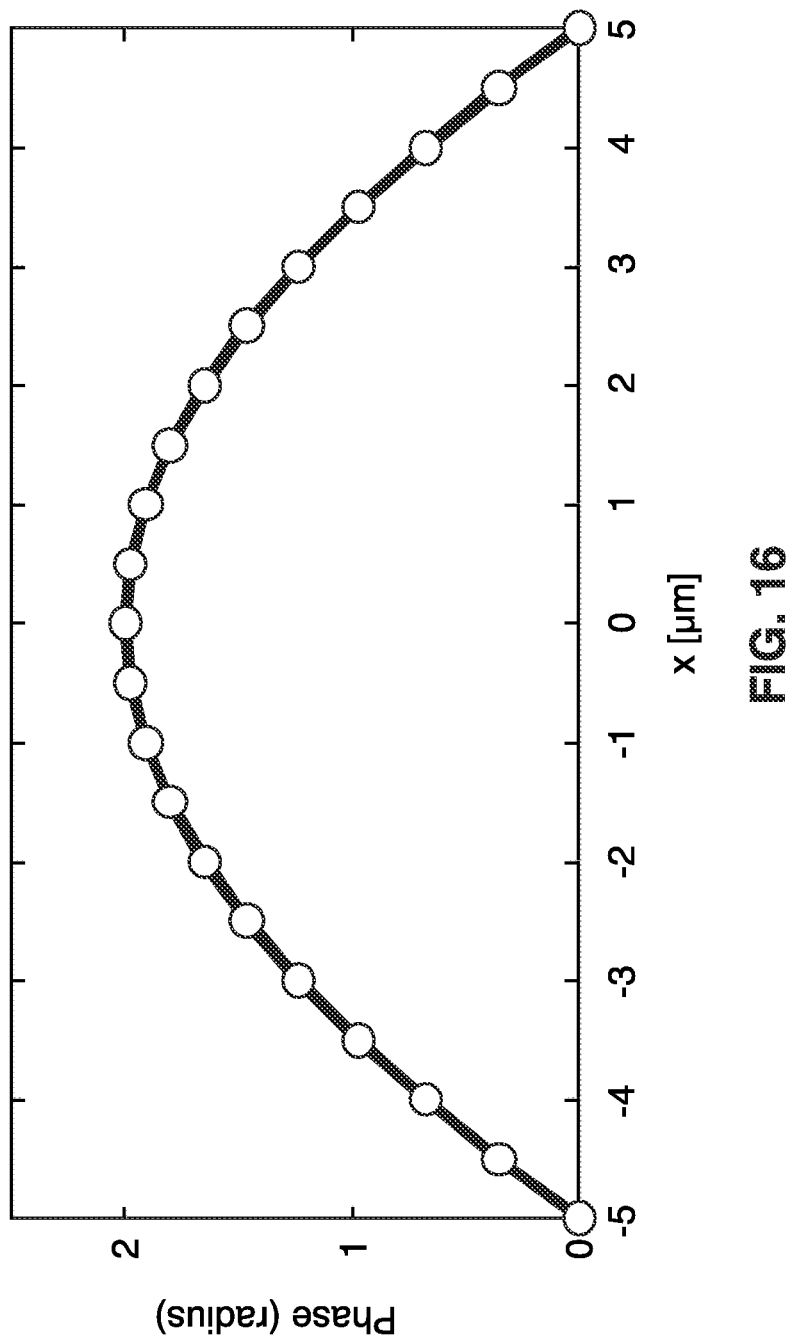
FIG. 16 is a graph of an ideal phase relationship (in radians) for the 1D lensing HCG of FIG. 15.

FIG. 16 depicts an ideal phase relationship for an HCG lens configured according to the invention. If the phase distribution along the x axis is an ideal phase distribution, the plane wave can be focused quite well. It can be proven that an ideal phase distribution for a lens is given by:

$$\phi(x) = \frac{2\pi}{\lambda}\left(f + \frac{\phi_{max}}{2\pi}\lambda - \sqrt{x^2 + f^2}\right) \quad (17)$$

where which $\phi$ is the phase, x is the distance along the x axis, f is the focal length, and $\phi_{max}$ is the maximum phase change between the middle and the edge of a focusing element.

Figure 17:
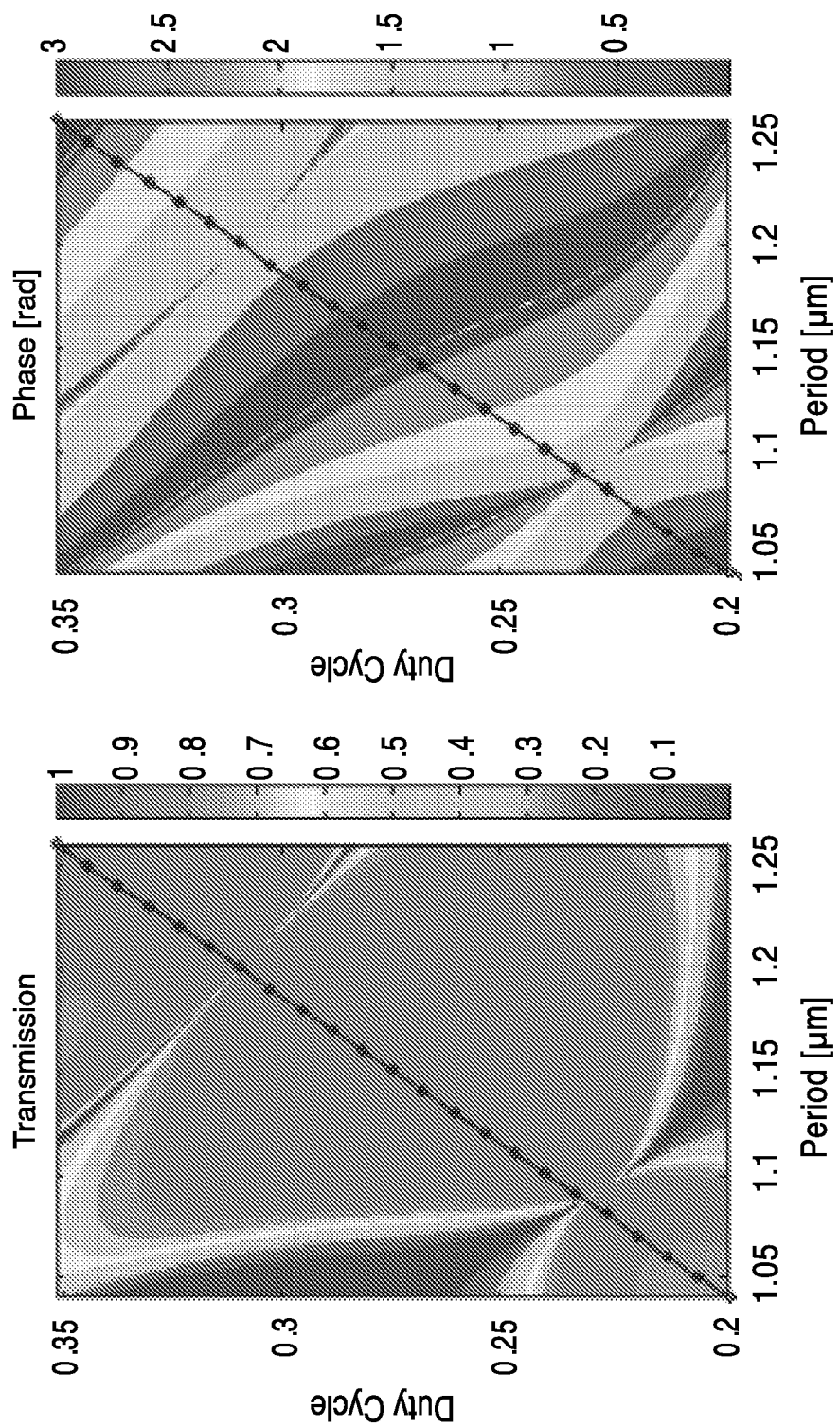
FIG. 17A and FIG. 17B are contour plots of transmission and phase relationships within an HCG according to an element of the present invention.

FIG. 17A and FIG. 17B depict transmission and phase relationships for the HCG lens shown in FIG. 15. The horizontal axis represents the period of the grating, and the vertical axis is the semiconductor duty cycle of the grating. It can be seen in the figure along the dotted diagonal line, that transmission is very high, with a phase change of $2\pi$, which is ideal for an HCG lens.

The HCG focusing lens has a number of advantages when compared to conventional lenses. Important advantages include that these HCG lenses are ultra-thin, light and planar, and that they can be readily fabricated using standard photolithography processes. Therefore, HCG lenses can be readily integrated with CCD and CMOS integrated circuits, enabling compact high resolution imaging and display devices.

In addition, well-designed HCG lenses can achieve both high NA and low loss, which are very useful attributes for use in a number of application areas, such as in the making of scalable microscopes and telescopes.

Still further, the phases of the HCG are dependent on the wavelength of the light. Light with different wavelengths are subject to different phase changes through the grating, and thus can be focused and separated after passing through an HCG lens. Accordingly, HCG lenses can be potentially used as compact wavelength-division multiplexing and demultiplexing devices in optical communication.

One of the key attributes of HCG lenses is the ability to engineer their phases, whereby not only can one change the spot size of the light beam, but one can also convert the optical mode of the light beam, providing phase distribution which is carefully designed. These aspects make it possible to create an optical mode converter based on an HCG lens.

By way of example and not limitation, the HCG lenses can be utilized in a wide range of applications, including, but not limited to the following: compact imaging and display devices, high efficiency CCD with HCG micro-lens array, high efficiency solar cells with sunlight-concentrating HCG lens, scalable microscope and telescope, high focusing power reflector for storable absorber and VCSEL, integrated focus sensor, wavelength-division multiplexing and demultiplexing, and optical mode converter.

3. Planar Focusing Reflectors and Lenses

This section describes a novel planar subwavelength HCG-based focusing reflector and lens which provides both high Numerical Aperture (NA) and low loss. The HCG is a sub-wavelength grating comprised of bars having a high refractive index, which can be fabricated using standard photolithography, that are fully surrounded by a low index medium, which may comprise one or more materials. Recently, the inventors have demonstrated broadband reflectors and high-Q resonators using periodic HCGs. The reflectors can be designed for light incidence at any angle between surface normal and grazing incidence. HCGs may be implemented to provide high reflectivity, partial reflectivity, or high transmissivity. In addition, it is of particular benefit in many applications that the phase of the reflection (or transmission) coefficient may also be chosen independently of the amplitude. By designing the HCG in a non-periodic manner, a phase distribution as in a typical lens may be achieved, within a planar device having a size on the order of approximately 1 μm thick.

Figure 18:
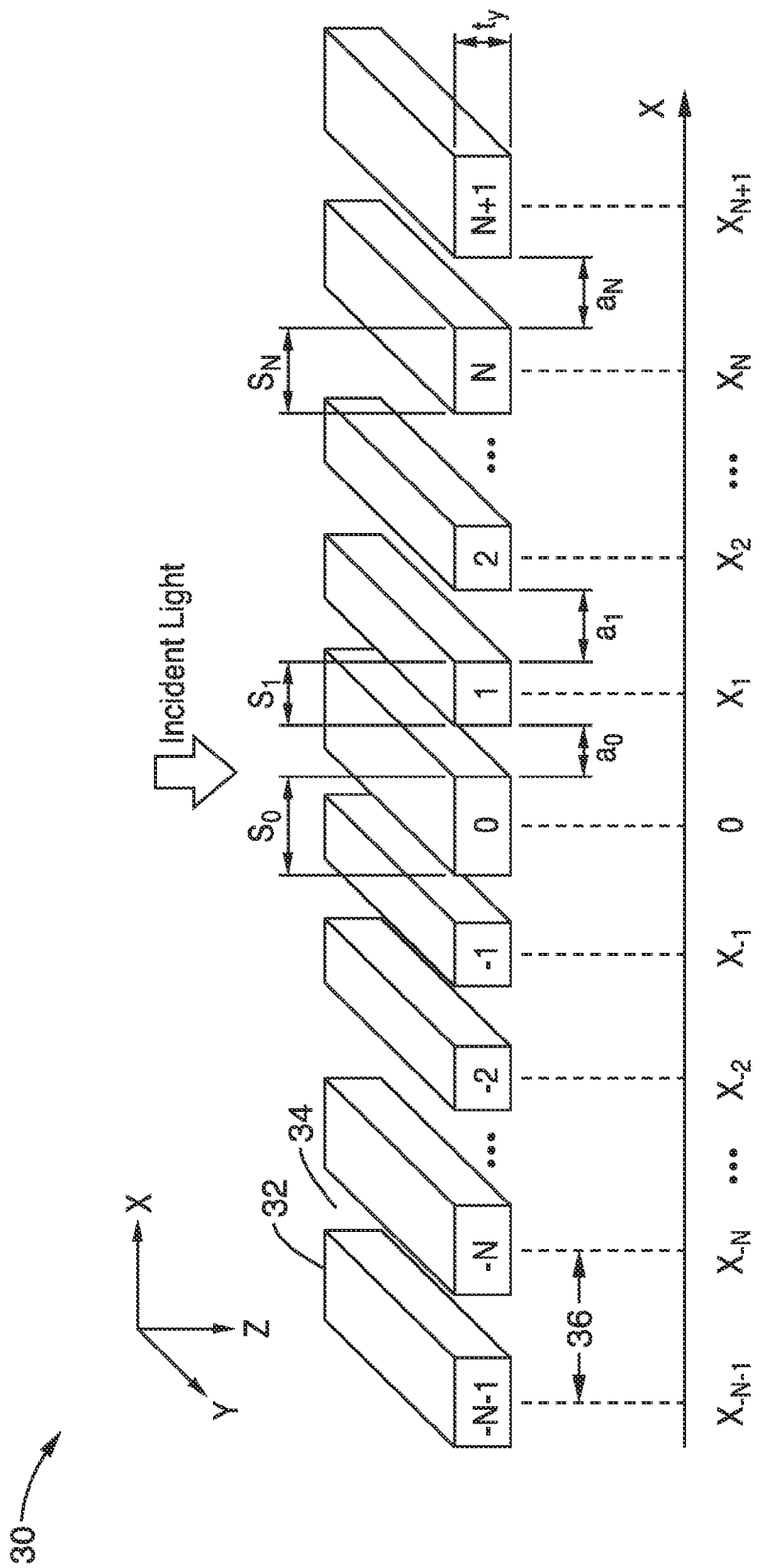
FIG. 18 is a schematic of a lensing high-contrast grating (HCG) according to an element of the present invention.

FIG. 18 illustrates an example embodiment 30 of a non-periodic high contrast grating (HCG) having bars 32 with a high index of refraction, which are surrounded by low index material 34, such as air. The period between adjacent bars 36 is depicted as varying along the distribution path of the grating bars. High reflectivity or high transmissivity in a sub-wavelength grating (s+a<$\lambda_{SurroundingMaterial}$) can be achieved by proper choice of grating parameters.

This HCG lens can be most simply implemented as a single layer, subwavelength grating where the grating bars consist of high-index material (e.g., AlGaAs, silicon, and so forth) that are surrounded by low-index media (e.g., air or silicon oxide). The physical parameters of bar width s (showing $s_0, s_1, \ldots, s_N$ for a sequence of bars), air gap a, and thickness $t_g$, as shown in FIG. 18 largely control the complex reflectivity of the grating. For simplicity of calculation, only one low-index medium surrounding the high index grating bars is described herein, although similar results can be achieved in response to using different materials (e.g., silicon HCG on $SiO_2$). For a non-periodic HCG, different HCG bars (indexed as 0, 1, 2, and so forth, where 0 is the middle bar) have different bar widths and air gaps, while the thickness remains constant. In this particular example, symmetry requirements dictate that the –nth bar has the same dimension as +nth bar (n=1, 2, and so forth). However, it should be appreciated that in general HCG focusing elements may be designed to operate with non-normally incident light, removing this symmetry requirement.

The reflectivity mechanism of an HCG is described as follows. For the sake of simplicity of illustration, the HCG can be physically thought of as an array of short slab waveguides with its propagation direction along the z-axis. The incident wave as depicted by the large downward arrow in FIG. 18 excites multiple modes of the array. The first two modes are the most significant modes, while the higher order modes are below cutoff and have the form of evanescent surface-bound waves. These two modes propagate along the z-direction within the grating, and reflect back at the bottom output plane. The constructive or destructive interference between these two modes (along with their reflections) determines the reflectivity of the HCG. The HCG thickness is an important implementation parameter as it determines the phase accumulated by the modes, and therefore controls their interference. The phases accumulated by the modes inside the HCG also determine the phase of reflectivity and transmissivity.

Figure 19:
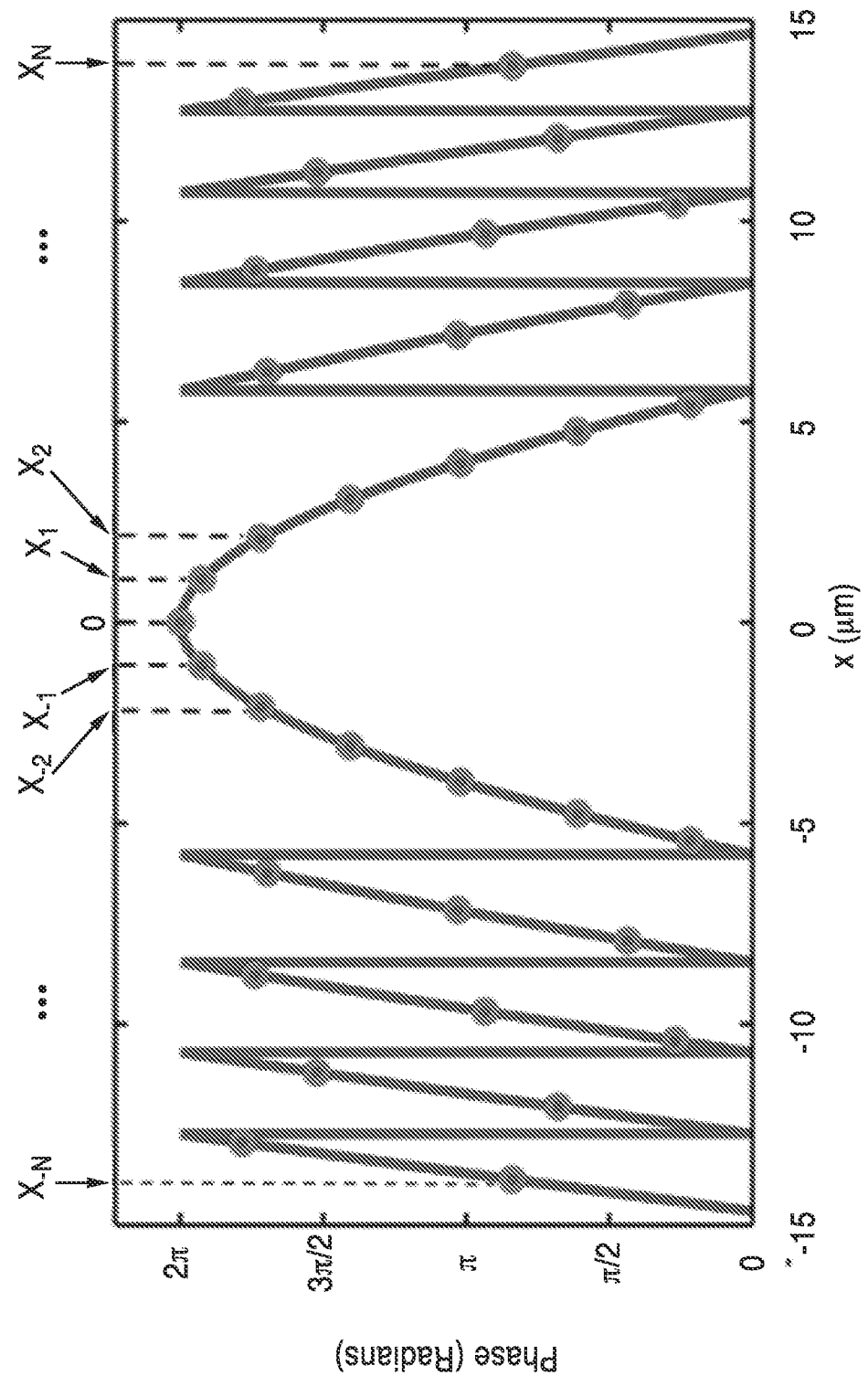
FIG. 19 is a graph of phase distribution for the lensing HCG of FIG. 18.

FIG. 19 depicts a phase distribution for the non-periodic HCG focusing reflector or lens, shown in FIG. 18. The curve illustrates the ideal phase distribution for a lens modulo $2\pi$. Along the curve are shown circles which indicate the phases of each HCG bar. Focusing of the HCG is achieved in response to properly selecting design elements of the grating phases.

When a wave is incident upon a chirped HCG, the reflected and transmitted components will develop a phase variation along the x axis, due to the lateral dimension of chirp along the x axis. If the phase distribution along the x axis is chosen properly, the plane wave is focused. An example of one such focusing distribution, obtained from geometrical optics, was already recited in Eq. 17.

It will be appreciated that when the phase $\phi(x)$ is more than $2\pi$, it can be mapped to an equivalent value between 0 and $2\pi$, and explains the sawtooth shape of the phase distribution curve in FIG. 19, with each sawtooth corresponding to a different $2\pi$-window. This distribution is difficult to achieve for conventional reflectors and lenses. For a chirped HCG, each bar with a certain bar width and air gap can provide the desired phase (shown in the circles in FIG. 19). Putting these HCG bars together is equivalent to using a discrete phase distribution to approximate the ideal distribution. This approximation is fairly accurate owing largely to the sub-wavelength dimensions of the HCG. In addition to phase distribution, the magnitude of the reflection (or transmission) coefficient must be high if low-loss mirrors, and/or lenses are to be fabricated.

After selecting a focusing distribution, designing HCG focusing elements is straight forward. Given the requirements, such as focal length and NA of a reflector or lens, a phase distribution can be calculated; for example, according to Eq. 17. The next step is to find out a one-to-one correspondence between complex reflection and/or transmission coefficients and HCG dimensions. In this example, the design of an HCG focusing reflector is considered. The reflectivity and phase can be calculated as a function of HCG dimensions using Rigorous Coupled Wave Analysis (RCWA).

Figure 20:
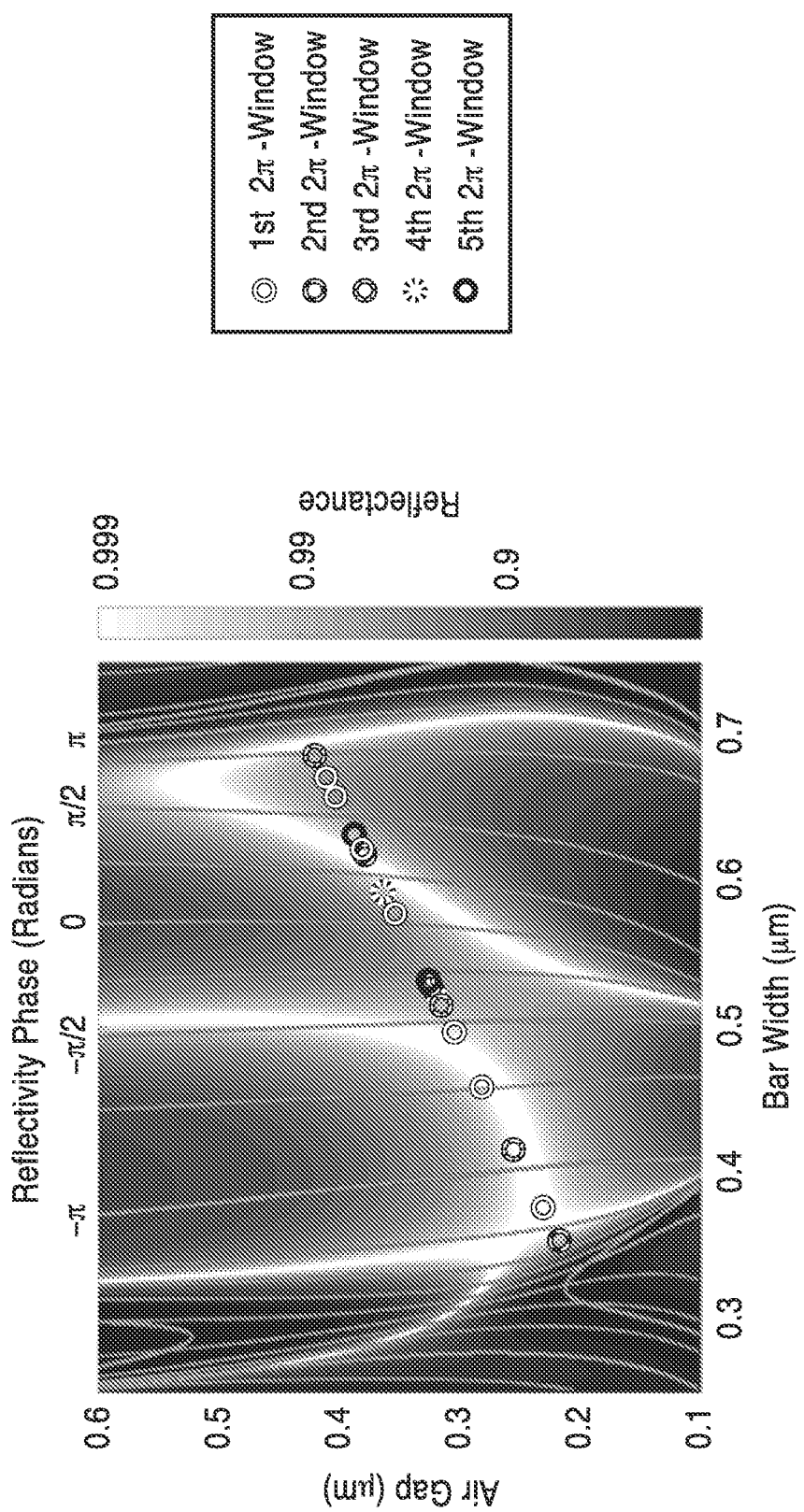
FIG. 20 is a contour plot of reflectance and phase for a lensing HCG according to an element of the present invention.

FIG. 20 depicts reflectance contour, phase contour, and actual dimensions for an example HCG focusing reflector. Reflectance is shown in a logarithmic scale with the intensity legend on the right side, as a function of air-gap and bar width, shown on the vertical and horizontal axis, respectively. Iso-phase lines are seen throughout the graph. Actual dimensions of an HCG focusing design can be seen in the graph indicated by the small circles indicating different $2\pi$-windows. All the actual dimensions are chosen on a line where R>0.9 and maximum phase change is $2\pi$. Shown in FIG. 20 are reflectance and phase for an HCG with thickness of 1.2 µm. It should be appreciated that thickness has already been optimized to obtain high reflectance and a large phase change. The bar width varies from 0.25 µm to 0.75 µm, and air gap between bars from 0.1 µm to 0.6 µm. The actual dimensions chosen for an HCG reflector design are shown on this map as a series of circles, shaded according to their corresponding $2\pi$-window (FIG. 19). The refractive index of the HCG bars is 3.48, corresponding to the index of silicon at 1.55 µm. The design shown is for TM polarization, in which electric field vector is perpendicular to the grating bar direction, at a wavelength of 1.55 µm. It should be noted that although the reflection map is calculated for periodic HCGs, it can be beneficially used in arriving at a design for a non-periodic chirped HCG reflector, as shown later by Finite-Difference Time-Domain (FDTD) simulations.

Prior to selecting the actual HCG dimensions, a phase path is chosen which encompasses a total phase shift of at least $2\pi$ and which only traverses regions of high reflectivity. For simplicity, the initial work uses a straight line to select designs, as seen in FIG. 20. Nonetheless, this phase path still remains above 90% reflectivity at all points, wherein the final HCGs all provide low loss. The actual HCG dimensions are chosen from the phase path in accordance with Eq. 17. These points specify the width and position of each bar in the HCG. After the design of the HCG is determined, FDTD numerical simulation is performed to evaluate the performance of the focusing element.

The following describes a number of example embodiments, by way of simulations carried out at a wavelength of 1.55 µm for normal incidence. It should be appreciated, however, that the design is scalable to any desired wavelength, and can be generally applied to any desired angles of incidence. Taking advantage of the $2\pi$ phase-window concept, the design method is scalable, making both HCG micro-reflectors/lenses and large area reflectors/lenses possible, though only HCG reflectors and lenses in the microscale are specifically described here. The designs in the first set of examples are one-dimensional, corresponding to a cylindrical lens or trough reflector. While the subsequent set of examples are applicable to two-dimensional focusing elements, corresponding to circular lenses and mirrors.

An HCG focusing reflector can be configured for either TM or TE polarization. In TM polarization, the polarization of the incident light has an electric field vector perpendicular to the grating bar direction. In TE polarization, the polarization of the incident light has an electric field parallel to the grating bar direction. In the TM polarization of FIG. 20, the thickness of the HCG is fixed at 1.2 µm, while the bar width varies from 0.35 µm to 0.69 µm and the air gap varies from 0.22 µm to 0.42 µm.

Figure 21:
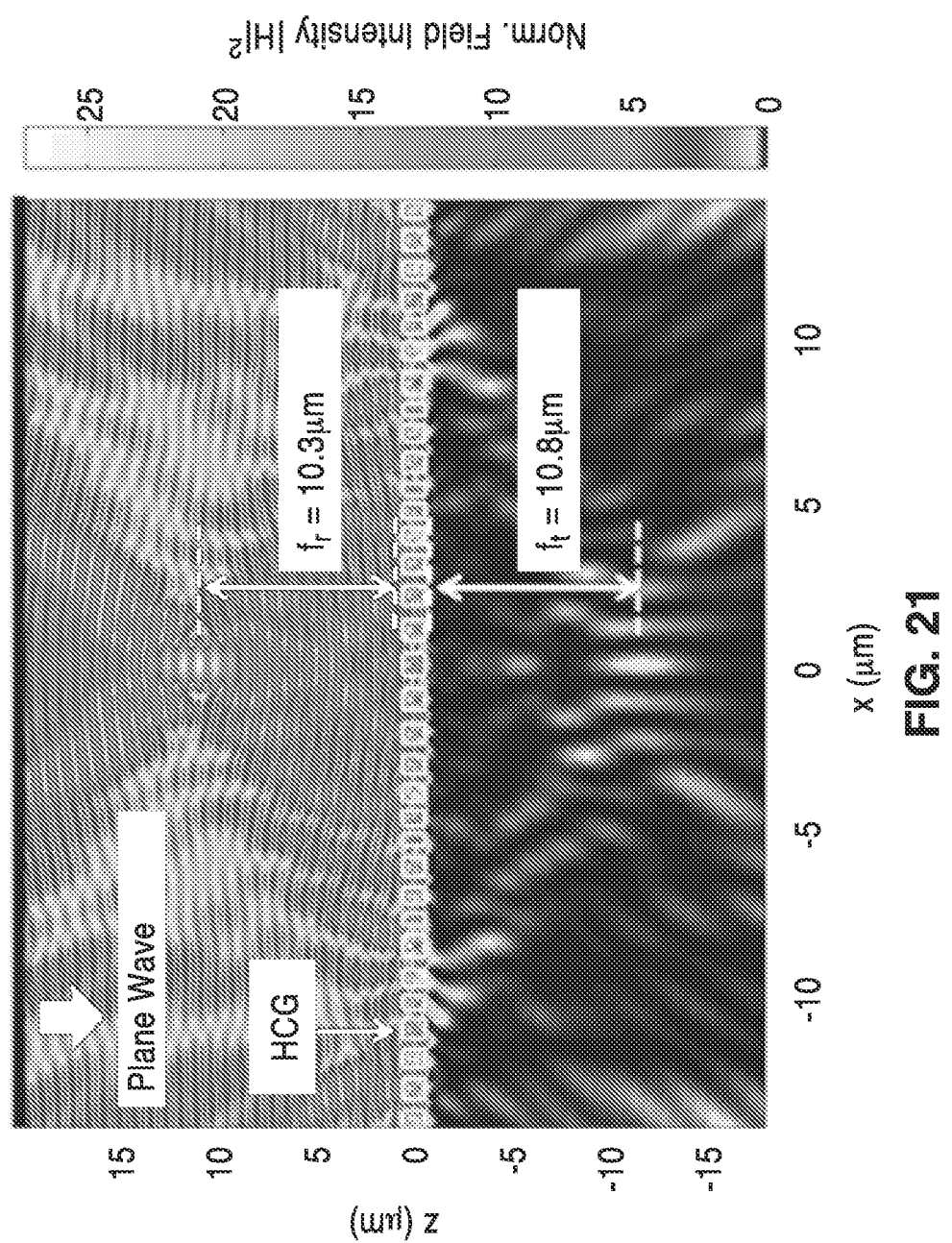
FIG. 21 is a field intensity distribution for reflection and transmission on a lensing HCG according to an element of the present invention.

FIG. 21 depicts an H-field intensity distribution, which is normalized by incident field intensity, on both the reflection side and the transmission side of an HCG focusing reflector. HCG bars are denoted by white outlined boxes along the approximate centerline of the graph. Shading is in response to normalized field intensity, with z and x axis depicted.

After the plane wave, incident from the positive z half-plane, is mostly reflected by the 28.6 µm wide HCG reflector, it is focused to a spot 10.3 µm above the lens. Thus, the NA is 0.81, and the lens has total reflectance of 93%, which means the transmission loss is only 0.3 dB. The intensity oscillations on the reflection side along z-axis in FIG. 21 are caused by interference between the reflected and incident waves.

Figure 22:
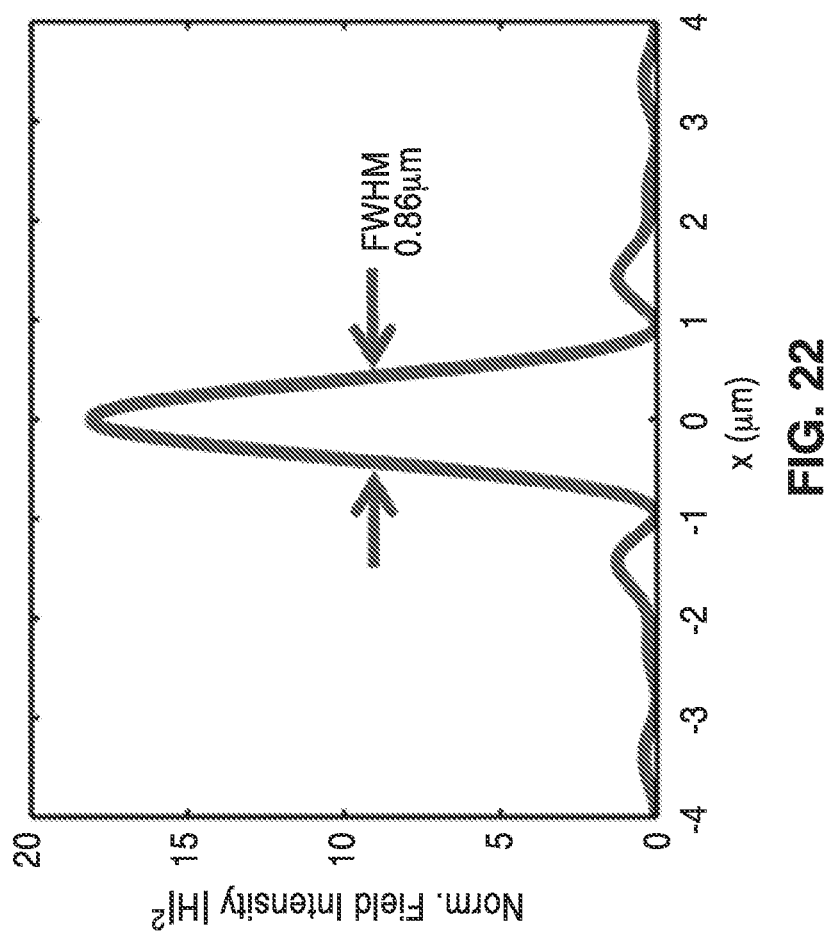
FIG. 22 is a plot of H-field intensity distribution at the focal plane according to an element of the present invention.

FIG. 22 depicts the H-field intensity distribution, normalized by incident field intensity, at the reflection focal plane and plotted after the incident wave is subtracted. The implementation has full-width-half-maximum (FWHM) of 0.86 µm, which is extremely close to the diffraction limit. It should be noted that this field distribution is plotted after the incident wave is subtracted from the total field intensity. It should also be noted that the above design algorithm is based on the reflection coefficient calculated from periodic HCGs.

The reflection and transmission properties of an HCG are determined by the internal modes, which change slightly when the periodicity of the HCG is disturbed. Therefore a bar-by-bar optimization process is preferably carried out, in which the dimensions of each bar (grating element) are adjusted to minimize energy leakage to the transmission side. Using this technique, total reflectance is increased from an initial value of 81% to the 93% value achieved here. In addition, the reflectivity may be increased with further optimization of the phase path, such as utilizing a curved line with better matched reflectivity instead of a straight line.

It should be appreciated that the HCG lens device exhibits a unique phenomenon referred to herein as "double focusing", which can be seen in FIG. 21 with both the reflected and transmitted waves being focused, even though the transmitted energy is much lower. Moreover, the focal length on the transmission side is 10.8 µm, almost the same as that of the reflection side.

Figure 23:
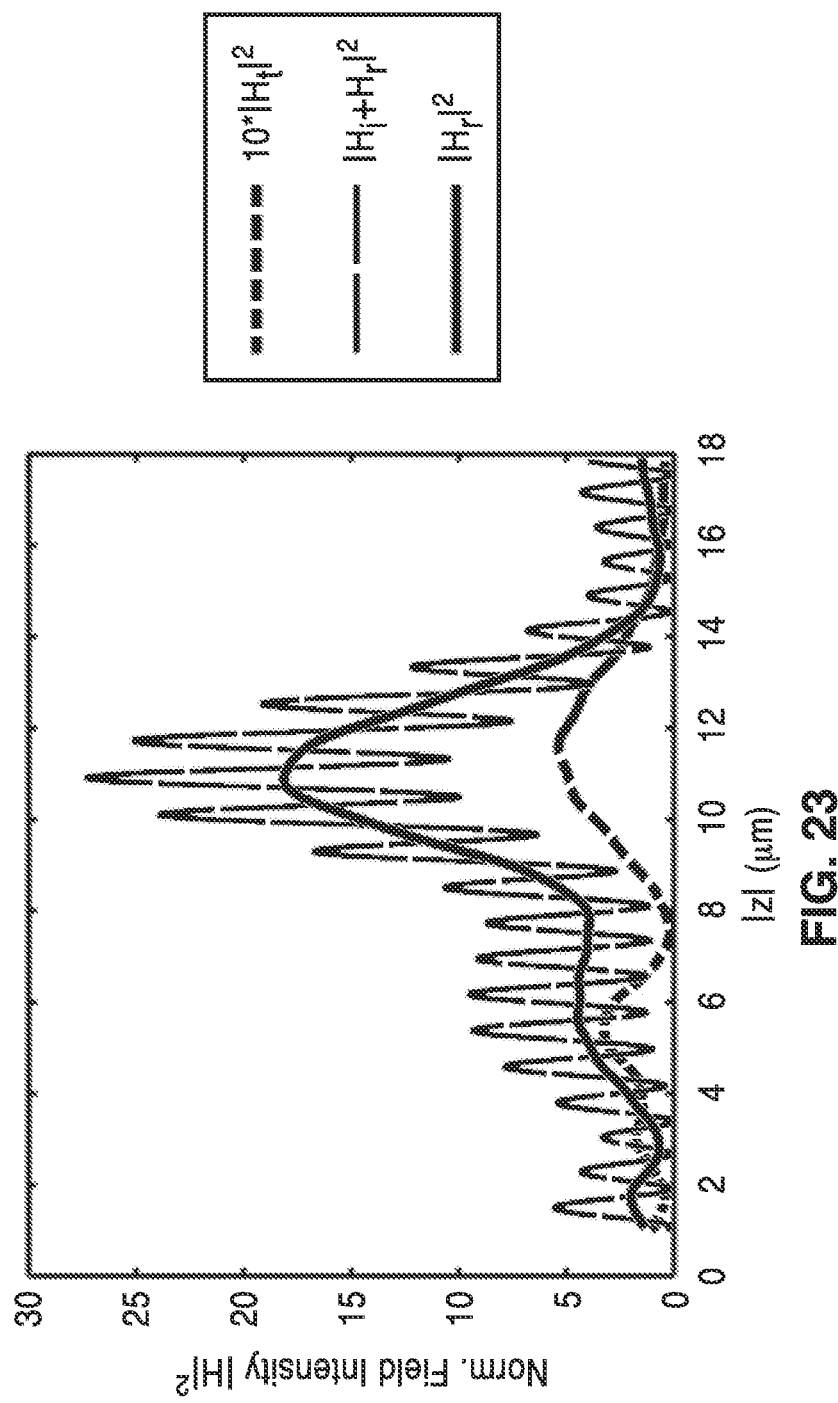
FIG. 23 is a plot of H-field intensity distribution for the transmitted and reflected waves along the direction of incident light at the center of HCG lens (along z axis at x=0 of FIG. 21) according to an element of the present invention.

FIG. 23 depicts an H-field intensity distribution, normalized by incident field intensity, for both reflected wave and transmitted waves along z axis at the center of the reflector (x=0). The lower dashed curve is H-field intensity of the transmitted wave, amplified by ten. The high frequency long-dashed curve is H-field intensity of the reflected wave including the interference pattern, and is centered about a solid-line curve which is H-field reflected wave intensity after the incident wave, comprising the reflected wave component of the high-frequency curve, is subtracted out.

Figure 24:
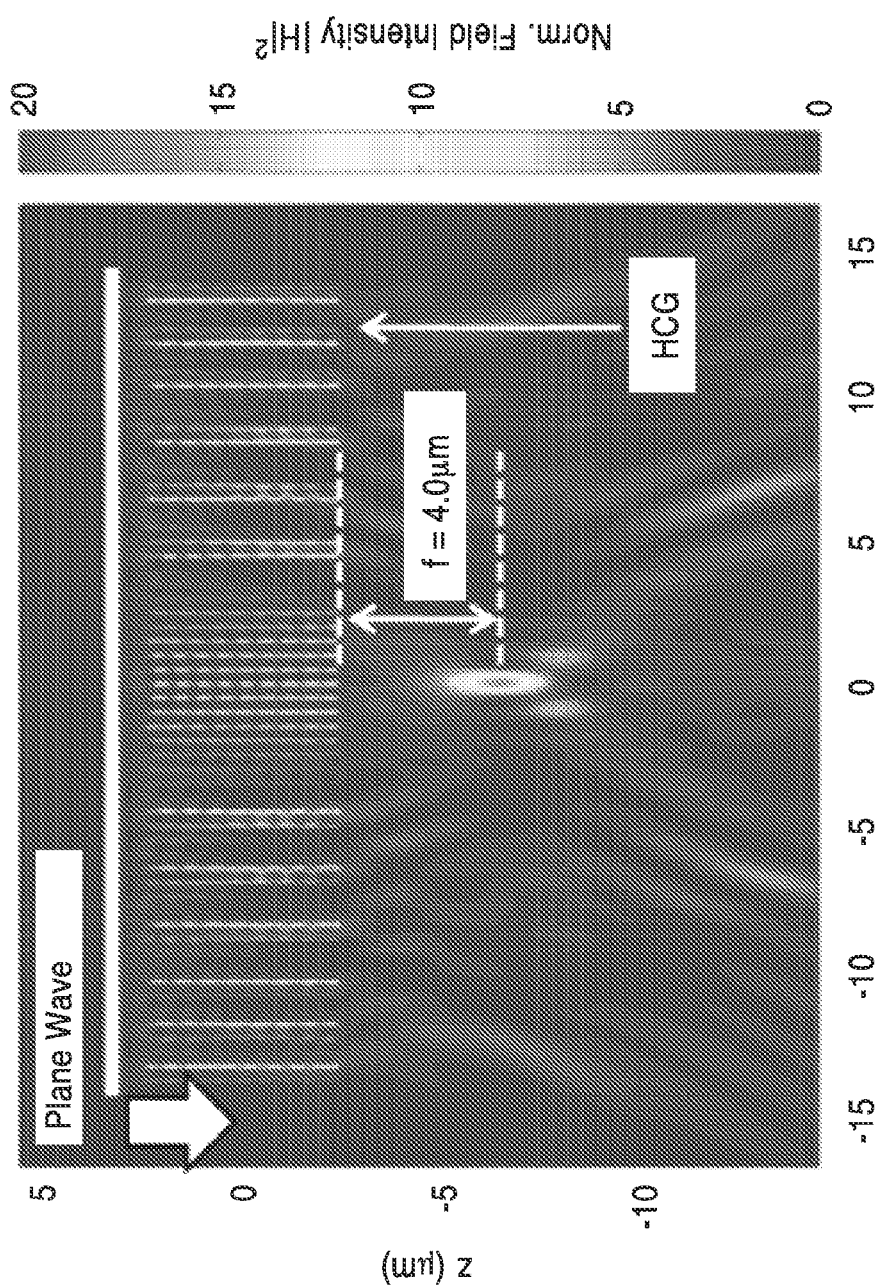
FIG. 24 is an H-field distribution of an HCG lens according to an element of the present invention.

FIG. 24 depicts an H-Field intensity distribution of an HCG lens which is normalized by incident field intensity. A plane wave is incident from the positive z direction and focused to a spot 4.0 µm from the bottom edge of the HCG lens. The figure illustrates the phenomenon clearly by plotting the H-field distribution for both the reflected and transmitted waves along the z axis at the center of the reflector (x=0). This effect is due to the relationship between reflection and transmission phase for a lossless, reciprocal, symmetric system as follows:

$$\phi_R - \phi_r = \frac{\pi}{2} + m\pi \quad m = 1, 2, \ldots \quad (18)$$

where $\phi_R$ and $\phi_r$ are the phase of reflection and transmission, respectively. This relation is confirmed by calculating phase of reflectivity and transmissivity for the planar HCGs lenses. Since the difference between $\phi_R$ and $\phi_r$ is either $\pi/2$ or $3\pi/2$, the phase distributions on either side of the HCG can be made nearly the same with possible discontinuities with a phase jump of $\pi$. In fact, for the case in FIG. 24, $\phi_T(x)$ is nearly the same as $\phi_R(X)$, leading to the double focusing. There are two phase jumps of $\pi$ resulting in slight difference in focus lengths. The physics of the phase jump is beyond the scope of this inventive discussion. The capability to realize a planar focusing reflector with an additional focus on the transmission side is a unique property of HCGs. The double focus and possibility to design with any reflection/transmission combinations could significantly advance the design of VCSELs or solid state lasers, where a single HCG reflector acts as both a cavity mirror (providing optical confinement) and an external focusing element.

Figure 25:
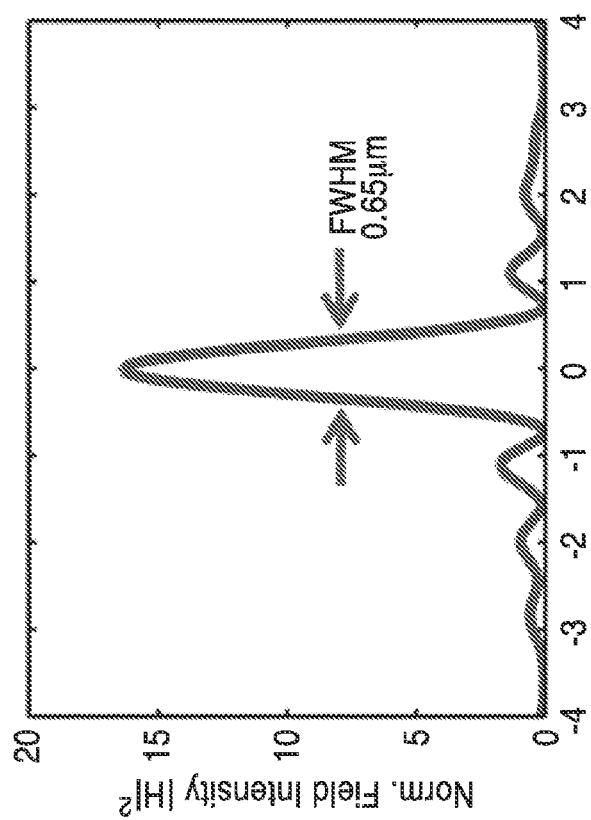
FIG. 25 is a graph of H-field intensity at the focal plane normalized to incident field intensity according to an element of the present invention.

FIG. 25 depicts an H-field intensity distribution at the focal plane, normalized to incident field intensity, demonstrating a FWHM of 650 nm. It will be appreciated that an HCG lens may also be configured according to the invention for TM polarization in which the electric field vector is perpendicular to the grating bar direction. An embodiment of this HCG lens was tested having HCG bar width varying from 85 nm to 180 nm, air gap varying from 415 nm to 320 nm, and thickness at 4.9 µm. After a plane wave passes through the 29.2 µm wide HCG lens, it is focused 4.0 µm below the lens, resulting in an NA of 0.96. The transmittance is 95%, which means the loss due to reflection is only 0.2 dB. At the focal plane, the field distribution is shown in the figure and has a FWHM of 0.65 µm.

3.1 Two-Dimensional Examples of 2D Lensing HCG.

Figure 26:
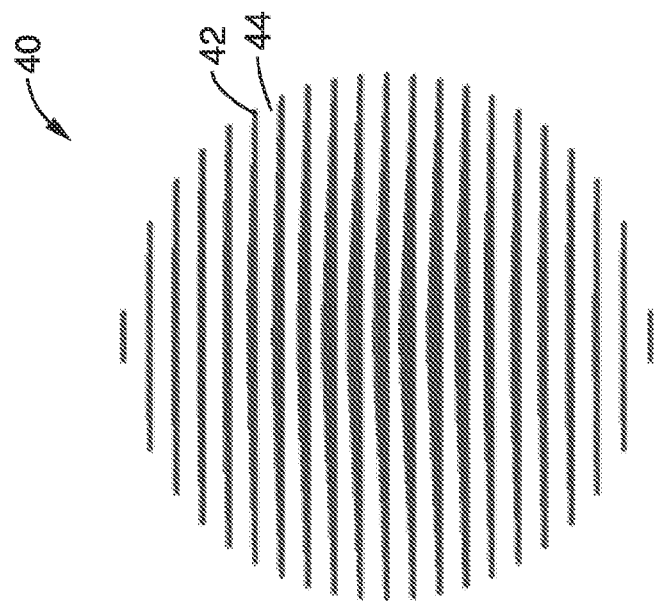
FIG. 26 is a schematic of a 2D HCG lens according to an element of the present invention.

FIG. 26 illustrates an example embodiment 40 of a 2D HCG lens, showing grating bars 42 with spaces 44. It will be seen that the two-dimensional (2D) HCG lens is configured by varying bar width and air gap inside each HCG bar. The width dimension varies along the length of the bars and along the distribution path of the bars. In this example embodiment, the diameter of the 2D HCG lens is 10 µm and HCG thickness is 3 µm, although it will be appreciated the HCG lenses can be fabricated from a small size that incorporates only a few grating bars, up to the practical limitations of fabrication. A 3D FDTD simulation is performed using a Gaussian beam source. The lens is designed for TE polarization in which the electric field is parallel to the grating bar direction.

Figure 27:
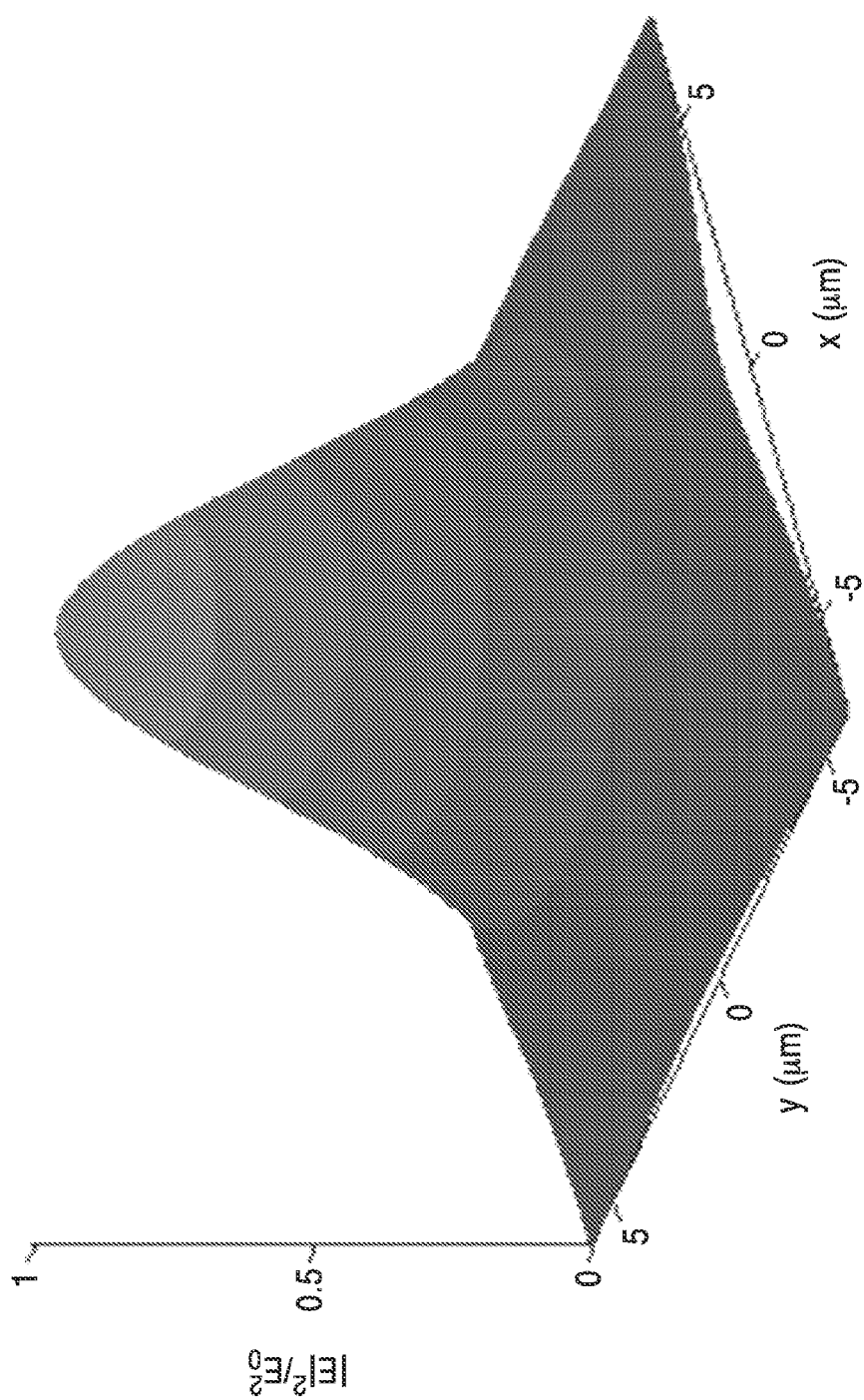
FIG. 27 is a 3D graph of e-field intensity for a Gaussian beam source used according to an element of the present invention.

FIG. 27 depicts a Gaussian beam source E-field intensity distribution to be applied to the lens of FIG. 26.

Figure 28:
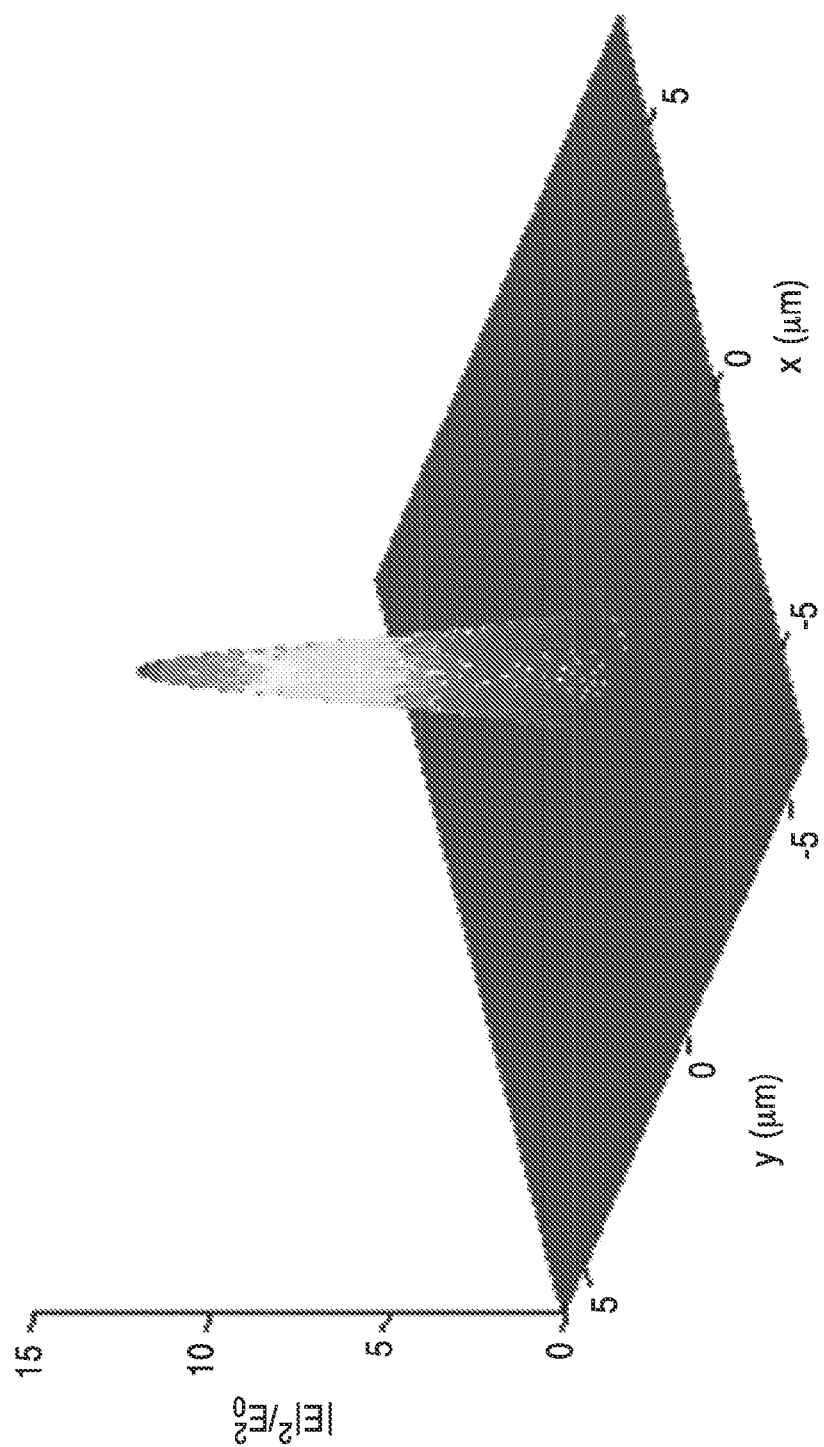
FIG. 28 is a 3D graph of E-field intensity distribution at the focal plane in response to the Gaussian beam source incident on said 2D HCG lens according to an element of the present invention.

FIG. 28 depicts E-field intensity distribution at the focal plane of the lens described in FIG. 26. The Gaussian beam is focused from 3.5 µm, at its waist radius, down to 0.89 µm, a 15× reduction in area. The corresponding increase in peak intensity is 12×, a value which can be improved by applying a bar-by-bar optimization procedure described in the text. Focused spot intensity should be increased in response to performing the bar-by-bar optimization scheme.

Figure 29B:
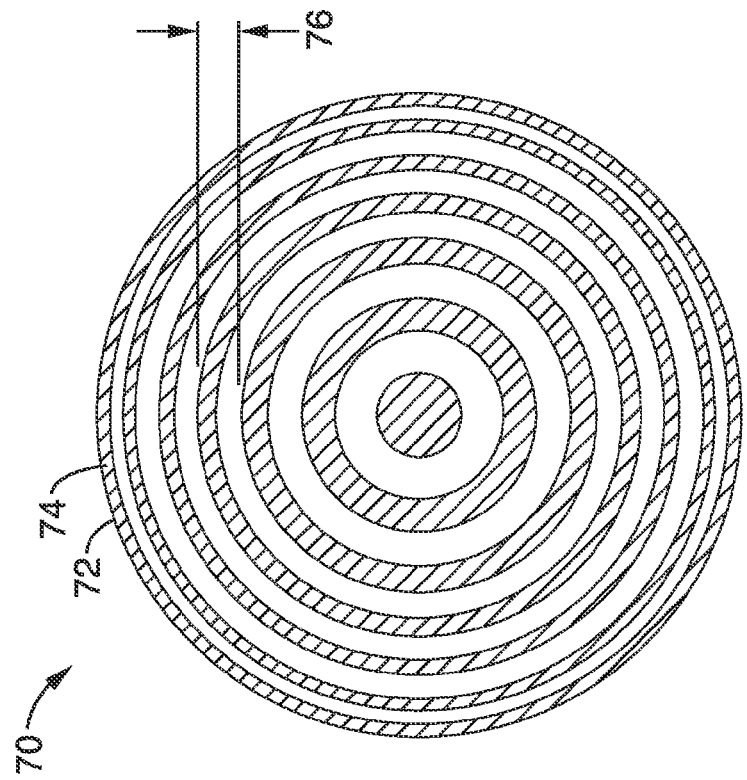
FIG. 29A and FIG. 29B are schematics of circular HCGs, non-chirped and chirped, according to elements of the present invention.
Figure 29A:
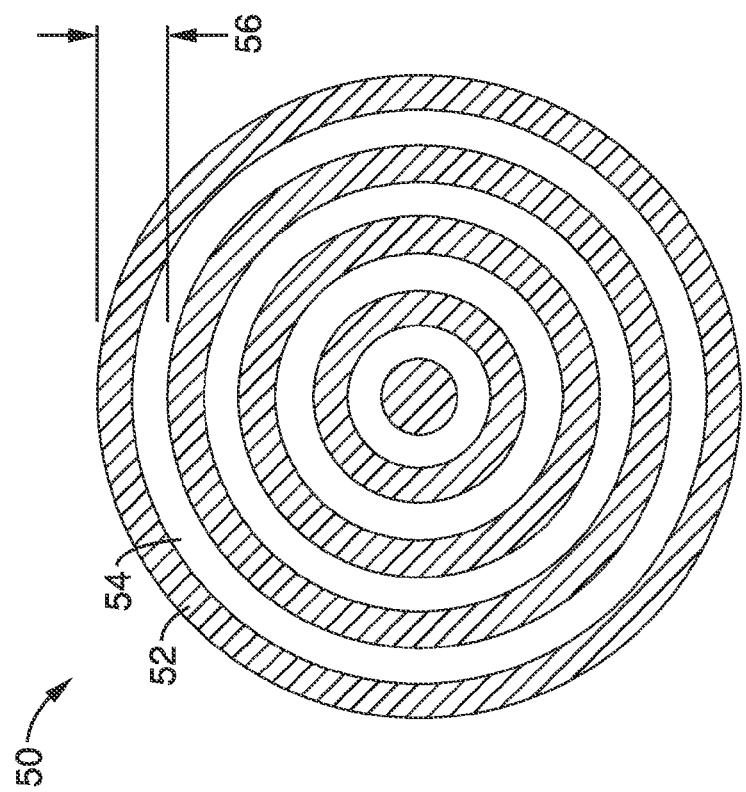

FIG. 29A and FIG. 29B illustrate example embodiments 50, 70 for circular HCG lenses. It will be appreciated that although these may appear superficially similar to zone plates, the design and principle of operation are radically different. A zone plate consists of rings spaced to optimize diffracted light intensity at a focal point. The thickness is chosen such that light from adjacent rings is shifted by $\pi/2$. In contrast, the circular HCG functions similarly to the linear HCG, with incident light exciting multiple modes within the structure. The modes of the circular HCG possess circular symmetry and are based on Bessel functions and modified Bessel functions, rather than sinusoids and exponentials. These modes propagate to the back facet of the device, reflect and mix, propagate back to the front side, reflect and mix again, and so on. High reflectivity occurs when the modes interfere destructively at the back facet, preventing transmission. High transmission occurs when the interference is constructive. In comparison with a phase zone plate, the size and spacing of the rings is chosen such that the modes have required propagation and mixing properties. The thickness is chosen such that the modes are phased to cancel at the back facet. The primary difference between the circular HCG in FIG. 29A and FIG. 29B and the structure shown earlier in FIG. 26 is that the HCG lens of FIG. 29A and FIG. 29B provides polarization independent reflectivity due to its circular symmetry. Focusing is achieved by chirping the ring size and spacing, thereby changing $\phi_R(r)$, the reflection phase as a function of the radial coordinate, or $\phi_T(r)$, the transmission phase.

The ring sizes and spacings of the circular HCG lens, which are not necessarily regular, are chosen such that circularly symmetric modes within the structure destructively interfere at the back facet, preventing transmission. FIG. 29A depicts a circular HCG 50 whose bar width 52, bar spacing 54, and period 56 are constant. FIG. 29B depicts a chirped circular HCG lens 70 in which bar width 72, bar spacing 74 and period 76 vary radially, so that the reflection phase varies radially $\phi_R(r)$.

3.2. Performance Evaluation.

Figure 30:
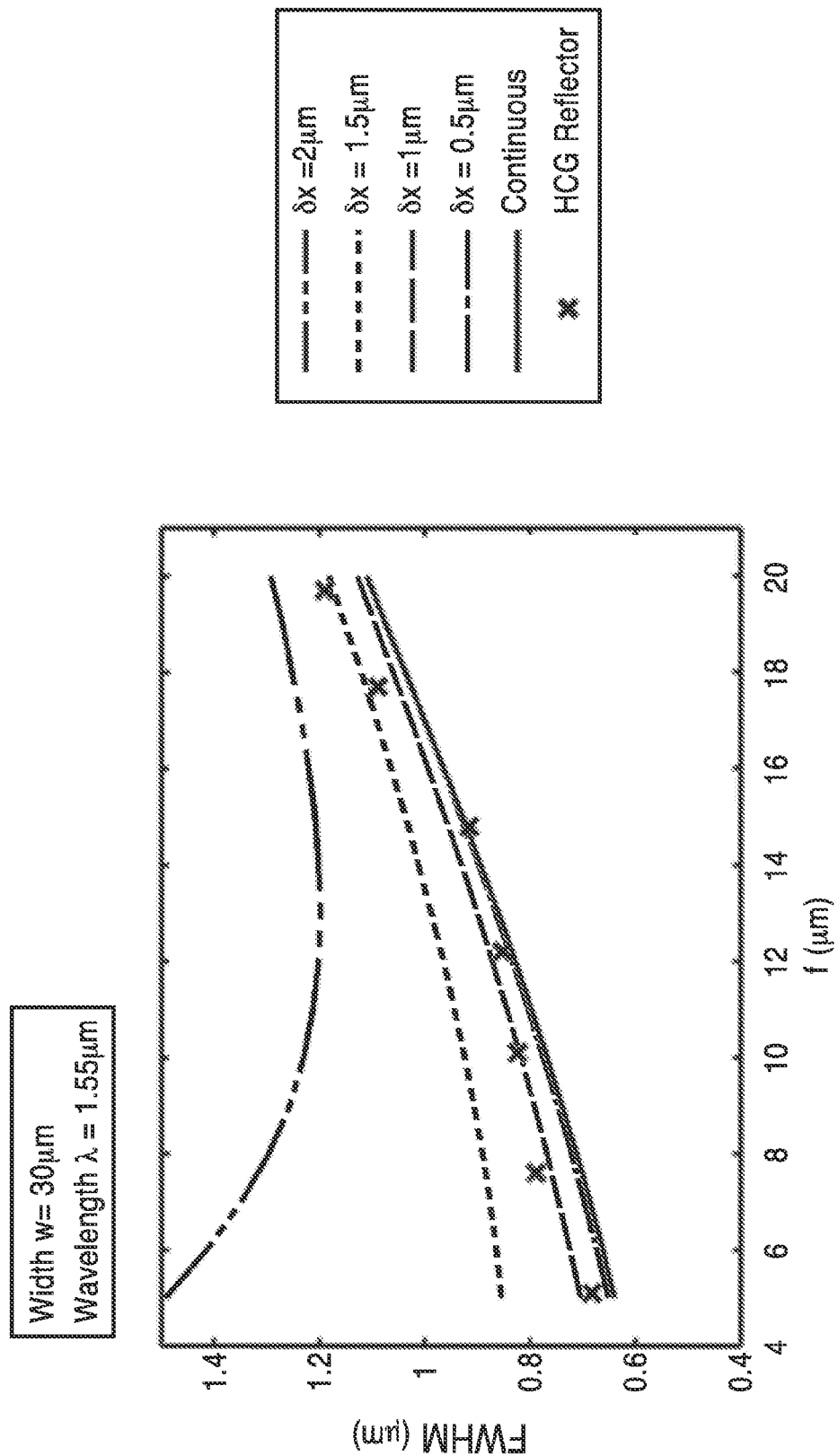
FIG. 30 is a graph of full-width half-maximum (FWHM) at the focal spot as a function of focal length according to an element of the present invention.

FIG. 30 depicts full width half maximum (FWHM) at the focal spot as a function of focal length f as calculated directly from the Huygens-Fresnel principle, with the lens width w held fixed at 30 µm. This is the diffraction limit for a lens with a 30 µm width and represents the best performance that can be expected. The solid-line curve is the continuous ideal phase distribution results, with the dashed-line curves representing discretized ideal phase distribution results for different constant phase elements of widths δx. The black crosses represent FDTD results for HCG focusing reflectors according to the invention.

Many applications require collimated light to be focused to a very tight spot or vice versa. Therefore the FWHM of the focal spot from an incident plane wave is of key importance. However, the phase distribution of HCG reflectors or lenses is essentially a discrete, stepped phase distribution that approximates this ideal, continuous, phase distribution. Thus, it is important to understand the effect of this discretization.

It should be noted that FWHM generally increases with focal length f. This increase arises because NA decreases when f increases, diminishing the focusing power. Accordingly, as the constant phase element width δx decreases, the curves converge to the continuous case, as expected. When δx is larger than the wavelength, shown in the uppermost dashed curve in FIG. 30, the deviation increases to a large value, especially for small focal lengths. This indicates that a sub-wavelength structure is crucial in order to achieve high focusing power with discrete phase elements. It is clear that HCG reflectors, as depicted by the black crosses in the figure, have focusing power very close to the diffraction limit shown as the continuous phase distribution.

Figure 31:
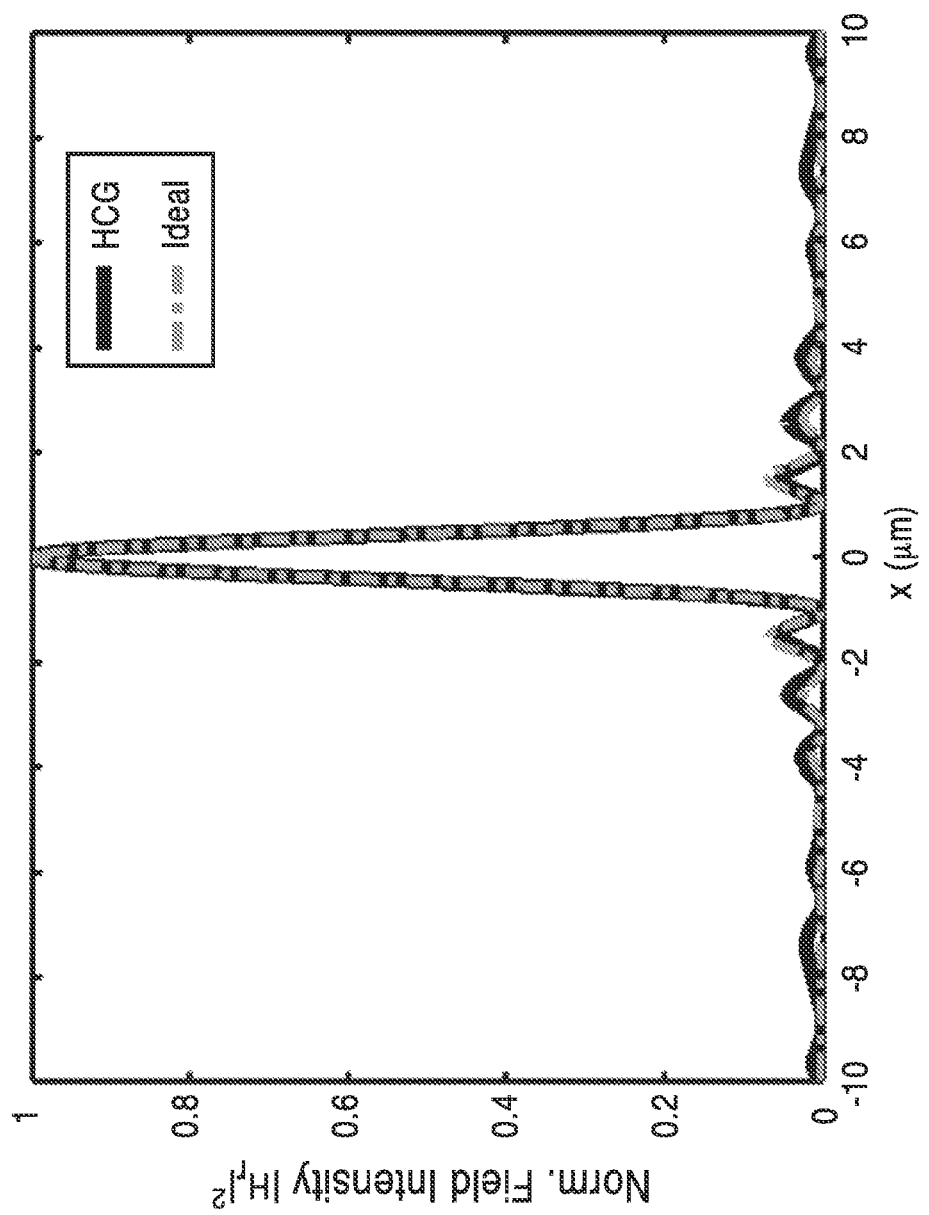
FIG. 31 is a graph of field intensity distribution at the focal plane for an HCG focusing reflector compared with an ideal lens according to an element of the present invention.

FIG. 31 depicts field intensity distributions at focal plane for a 0.7 NA HCG lens which are normalized by peak field intensity at the focal plane for an HCG focusing reflector, shown by the solid line, and a corresponding ideal phase lens, shown by the dashed line. Both cases have 30 µm width and 15 µm focal length. As can be seen in the figure, the match is excellent between actual and ideal, confirming the strong focusing power of HCG reflectors or lenses.

4. VCSEL with Double Focus HCG

Figure 32:
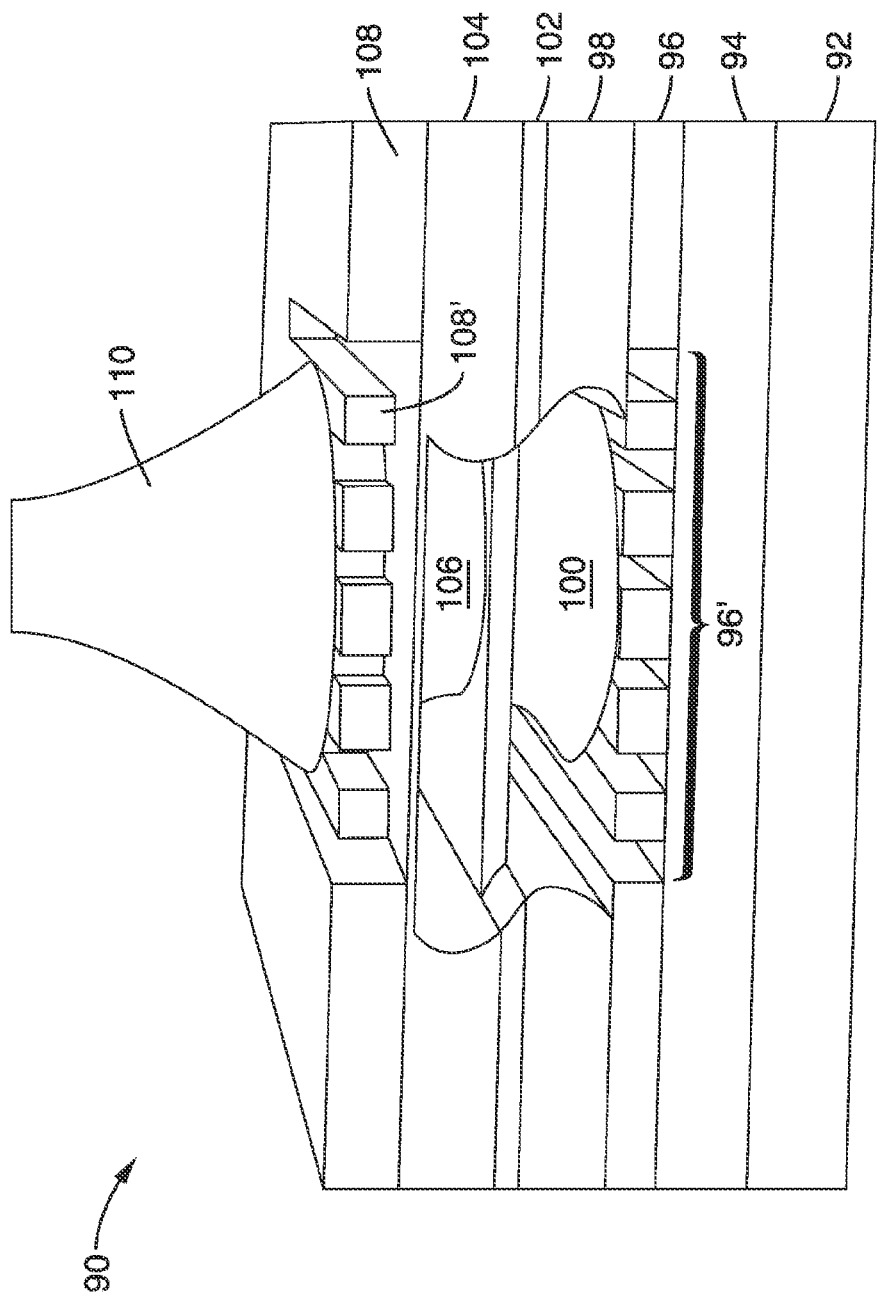
FIG. 32 is a 3D schematic of HCG focusing elements integrated within a vertical cavity surface-emitting laser (VCSEL) according to an element of the present invention.

FIG. 32 illustrates an example embodiment 90 of an HCG focusing element within a vertical cavity surface emitting laser (VCSEL). By way of example and not limitation, the VCSEL 90 is shown comprising a substrate layer 92, a low refractive index layer 94, a bottom reflector layer 96 with HCG 96'. A low refractive index layer 98, within which light 100 is shown focused from HCG 96' through layer 98 to an active layer 102 having an optical active region, such as comprising quantum structures, for instance quantum wells, wires, or dots. Although one form of quantum structure may be described for the sake of simplicity, it should be appreciated that quantum wells, wires, dots, or similar structures, although not wholly equivalent, can be substituted without departing from the teachings of the present invention. It will be appreciated that Light 106 is seen focused from HCG 108' in reflector layer 108, through low index layer 104 to active layer 102. Laser light output 110 is seen emitted from the top of the VCSEL focused by HCG 108'. As seen in the figure, the VCSEL structure relies on the double focusing of HCG lens 108'.

It should be appreciated that although a focusing HCG was described in the example embodiment being used for both the top and bottom mirror, that the focusing HCG can be implemented for either, or both, of said top and bottom mirror, without departing from the teachings herein. For example, the top mirror may comprise a focusing HCG as described with the bottom mirror as a DBR mirror, or alternatively, the bottom mirror may comprise a focusing HCG as described with the top mirror as a DBR mirror. However, it should also be appreciated that with the use of a DBR mirror an additional focusing means is required to replace the action of the focusing HCG. These alternate embodiments describe alternate subsets of that which is shown in FIG. 32.

5. Conclusions

The HCG lens-reflectors according to the present invention allow the use of simultaneous, optical feedback, optical confinement, and external focusing for a vertical cavity surface-emitting laser (VCSEL). These lens-reflectors can be applied to a wide range of optical devices, without departing from the teachings of the present invention, the following being provided by way of example and not limitation: (a) intensity enhancement for semiconductor saturable absorber for use in integrated mode-locked lasers; (b) mode-matching from optical fiber to waveguides; (c) replacements for lensed fiber tips; (d) optical scanners, scanning microscopes; (e) integrated free-space optical transmitters and receivers, (f) microlens arrays; (g) high-efficiency CCD imaging devices; (h) high-efficiency displays; (i) MEMS beam steering; (j) optical tweezers and trap arrays; and (k) focusing for integrated sensors.

From the description herein, it will be further appreciated that the invention can be embodied in various ways, which include but are not limited to the following.

The present invention provides methods and apparatus for transmissive and/or reflective focusing of optical energies. Inventive teachings can be applied in a variety of apparatus and applications, including monolithic circuit devices, and other optical elements.

As can be seen, therefore, the present invention includes the following inventive embodiments among others:

1. An apparatus for focusing optical energy, comprising: a high-contrast grating (HCG) having grating elements spaced apart from one another; said high-contrast grating elements having subwavelength width and spacing and an index of refraction at or exceeding approximately 2; a material, or materials, with a low refractive index surrounding said grating elements; wherein said high contrast grating is configured to focus reflection and/or transmission; and wherein grating element width and spacing varies to focus said reflection and/or transmission to a desired location in relation to said grating.

2. The apparatus of embodiment 1, wherein said high-contrast grating is planar.

3. The apparatus of embodiment 1, wherein said high-contrast grating is configured for high reflectivity, partial reflectivity, or high transmissivity.

4. The apparatus of embodiment 1, wherein said high-contrast grating is configured to allow selection of a wide range of phases while maintaining a certain reflectivity magnitude.

5. The apparatus of embodiment 1, wherein said high contrast grating comprises parallel bars of material having a high index of refraction and surrounded by a material having a low index of refraction.

6. The apparatus of embodiment 1, wherein said high contrast grating comprises curving bars of material having a high index of refraction and surrounded by a material having a low index of refraction.

7. The apparatus of embodiment 6, wherein said high contrast grating comprises concentric circular bars of material having a high index of refraction and surrounded by a material having a low index of refraction.

8. The apparatus of embodiment 1, wherein said high contrast grating has grating elements whose spacing is varied along a distribution direction of said high-contrast grating elements to provide varying phase changes along a length of said high-contrast grating to focus said reflection and/or transmission.

9. The apparatus of embodiment 1, wherein the width of the high contrast grating bars vary along a distribution direction of the grating bars which is perpendicular to the length of the grating bars to focus said reflection and/or transmission.

10. The apparatus of embodiment 1, wherein both width and spacing of the high contrast grating bars vary along a distribution direction of the grating bars which is perpendicular to the length of the grating bars to focus said reflection and/or transmission.

11. The apparatus of embodiment 1, wherein the width of the high contrast grating bars varies along the length of one or more grating bars to focus said reflection and/or transmission.

12. The apparatus of embodiment 1: wherein three physical parameters control reflectivity of the grating, comprising spacing, thickness, and width of the grating elements.

13. The apparatus of embodiment 1, wherein said optical energy is focused from a normally incident wave.

14. The apparatus of embodiment 1, wherein said high-contrast grating is configured for receiving said optical energy in a Transverse-Magnetic (TM) polarization.

15. The apparatus of embodiment 1, wherein said high-contrast grating is configured for receiving said optical energy in a Transverse-Electric (TE) polarization.

16. The apparatus of embodiment 1, wherein width and position of each grating element of said high contrast grating are selected in response to selecting a straight or curved line path along a phase contour map which only traverses regions of desired reflectivity.

17. The apparatus of embodiment 15, wherein said width and position of each grating element of said high contrast grating is further determined in response to a bar-by-bar optimization process in which the dimensions of each grating element (bar) is adjusted to minimize energy leakage to a transmission side for a reflector or a reflection side for a lens.

18. The apparatus of embodiment 1, wherein said high-contrast grating device is configured to provide double focusing with both the reflected and transmitted waves being focused.

19. An apparatus for focusing optical energy, comprising: a high-contrast grating (HCG) having grating elements spaced apart from one another; said high-contrast grating elements having subwavelength dimensions and an index of refraction at or exceeding approximately 2; and a low index of refraction material, or materials, surrounding said grating elements; wherein said grating is configured to receive an incident wave that is focused for reflection and/or transmission by said high contrast grating; and grating element width and spacing varies to focus said reflection and/or transmission to a desired location in relation to said grating; wherein said high contrast grating is chirped in response to varying grating spacing and/or width along a distribution direction of said high-contrast grating elements to provide varying phase changes along a length of said high-contrast grating to focus said reflection and/or transmission; and wherein said high-contrast grating device is configured to provide double focusing with both the reflected and transmitted waves being focused.

20. The apparatus of embodiment 19, wherein the width and/or spacing of the high contrast grating elements (bars) vary along a distribution direction of the grating elements which is perpendicular to the length of the grating elements and varies along the length of one or more grating elements to focus said reflection and/or transmission in two dimensions.

21. A monolithic vertical cavity surface emitting laser (VCSEL) apparatus, comprising: a top output mirror comprising a high-contrast grating (HCG) with grating elements of subwavelength spacing and width from a material having an index of refraction at or exceeding approximately 2; a first layer of low index of refraction material surrounding and adjacent to said periodically spaced grating elements; a second layer of low index of refraction material adjacent to said first layer of low index material; wherein said low index material has a refractive index of approximately 1 to 1.8 and comprises one or more materials; an active region, below the top mirror, having an optical active region disposed below said second low index of refraction material; wherein said grating elements of said first mirror are configured of varying width along their length and/or distribution direction to provide a lensing effect; and a bottom mirror.

22. The apparatus of embodiment 21, wherein said bottom mirror below said active region comprises a distributed Bragg reflector (DBR).

23. The apparatus of embodiment 22, wherein said bottom mirror below said active region comprises a planar non-focusing HCG.

24. The apparatus of embodiment 21, wherein said bottom mirror is below said active region and comprises a high-contrast grating (HCG) having periodically spaced grating elements of subwavelength dimensions from a material having an index of refraction at or exceeding approximately 2; wherein the lensing effect from said high-contrast gratings of said top mirror and said bottom mirror directs focusing of an optical mode within a confocal cavity onto said optical active region; and wherein the high-contrast grating of said top mirror is configured to provide double focusing with both the reflected and transmitted waves being focused.

25. A monolithic vertical cavity surface emitting laser (VCSEL) apparatus, comprising: a top output mirror; an active region, below the top mirror, having an optical active region disposed below second low index of refraction material; wherein said grating elements of said first mirror are configured of varying width along their length and/or distribution direction to provide a lensing effect; and a bottom mirror having a high-contrast grating (HCG) with grating elements of subwavelength spacing and width from a material having a high index of refraction at or exceeding approximately 2; a first layer and a second layer of low index of refraction material surrounding said grating elements of said bottom mirror and comprising one or more materials; wherein said first and second layer of low index material have a refractive index of approximately one to 1.8.

26. The apparatus of embodiment 25, wherein said top mirror above said active region comprises a distributed Bragg reflector (DBR).

27. The apparatus of embodiment 25, wherein said top mirror above said active region comprises a planar non-focusing HCG.

28. The apparatus of embodiment 25, wherein said top mirror comprises a high-contrast grating (HCG) having spaced grating elements of subwavelength dimensions from a material having an index of refraction at or exceeding approximately 2; wherein the lensing effect from said high-contrast gratings of said top mirror and said bottom mirror directs focusing of an optical mode within a confocal cavity onto said optical active region; and wherein the high-contrast grating of said top mirror is configured to provide double focusing with both the reflected and transmitted waves being focused.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 2

Derivation of the Reflectivity Matrix (R) of HCG
Field Overlap Matrices for electric ($E_{n,m}$) and magnetic ($H_{n,m}$) fields $E_{n,m}$ for TM, or $H_{n,m}$ for TE = (10)
$\Lambda^{-1}\int_0^a \epsilon_p \cos(k_{s,m} s/2) \cos[k_{a,m}(x - a/2)] \cos[2\pi n(x - a/2)/\Lambda]dx +$
$\Lambda^{-1}\int_a^\Lambda \cos(k_{a,m} a/2) \cos\{k_{s,m}[x - (a + \Lambda)/2]\}\cos[2\pi n(x - a/2)/\Lambda]dx$ $H_{n,m}$ for TM, or $E_{n,m}$ for TE = (11)
$(\Lambda\eta_{n,m})^{-1}\int_0^a \epsilon_p \cos(k_{s,m} s/2)\cos[k_{a,m}(x - a/2)]\cos[2\pi n(x - a/2)/\Lambda]dx +$
$(\Lambda\eta_{n,m})^{-1}\int_a^\Lambda \cos(k_{a,m} a/2)\cos\{k_{s,m}[x - (a + \Lambda)/2]\}\cos[2\pi n(x - a/2)/\Lambda]dx$

| | |
|---|---|
| Normalized wave impedance: | $\eta_{n,m} = \beta_m/\gamma_n$ for TM, and $\eta_{n,m} = \gamma_n/\beta_m$ for TE |
| HCG output plane reflection matrix: | $\rho = (H + E)^{-1}(H - E)^{-1}$ (12) |
| Phase matrix: | $\phi_{m,m} = \exp(-j\beta_m t_g); \phi_{m,k} = 0$ for $m \neq k$ (13) |
| Normalized entrance impedance: | $Z_{in} = E(I + \phi\rho\phi)(I - \phi\rho\phi)^{-1} H^{-1}$; I = unity matrix (14) |
| External reflectivity matrix: | $R = (Z_{in} + I)^{-1}(Z_{in} - I)$ (15) |

What is claimed is:

1. An apparatus for focusing optical energy, comprising:
a high-contrast grating (HCG) having grating elements spaced apart from one another;
said grating elements having subwavelength width and spacing and an index of refraction at or exceeding approximately 2;
a material, or materials, with a low refractive index surrounding said grating elements;
wherein said high-contrast grating is configured to focus for reflection and/or transmission; and
wherein grating element width and spacing varies to focus said reflection and/or transmission to a desired location in relation to said high-contrast grating;
wherein said high-contrast grating is configured to provide double focusing with both reflected and transmitted waves being focused.

2. The apparatus recited in claim 1, wherein said high-contrast grating is planar.

3. The apparatus recited in claim 1, wherein said high-contrast grating is configured for high reflectivity, partial reflectivity, or high transmissivity.

TABLE 1

Mode Formulation both Inside and Outside HCG

| | Inside HCG ($-t_g < z < 0$) | | Outside HCG ($0 < z < -t_g$) | |
|---|---|---|---|---|
| ($0 < x < a$) Mode profiles inside inter-bar air-gaps: ($m = 0, 1, 2, \ldots$) | $\epsilon_p \cos(k_{s,m} s/2) *$ $\cos[k_{a,m}(x - a/2)]$ $\exp(\pm j\beta_m z)\hat{1}_\perp$ symmetric around centers of air-gaps: ($x = a/2$) | (1) | $z < -t_g$ Incident plane-wave: | $\exp(-j2\pi z/\lambda)\vec{\rho}_\perp$ — | (3) |
| ($a < x < \Lambda$) Mode profiles inside grating bars: ($m = 0, 1, 2, \ldots$) | $\cos(k_{a,m} a/2)$ $\cos\{k_{s,m}[x - (a + s/2)]\}$ $\exp(\pm j\beta_m z)\vec{\rho}_\perp$ symmetric around centers of bars: ($x = a + s/2$) | (2) | $z < -t_g$ Reflected modes: ($n = 0, 1, 2, \ldots$) $z > 0$ Transmitted modes: ($n = 0, 1, 2, \ldots$) | $\cos[2\pi n(x - a/2)/\Lambda] *$ $\exp[j\gamma_n (z + t_g)]\vec{\rho}_\perp$ $\cos[2\pi n(x - a/2)/\Lambda] *$ $\exp(-j\gamma_n z)\vec{\rho}_\perp$ | (4) (5) |
| Dispersion relations inside HCG: $k_{a,m}^2 = (2\pi/\lambda)^2 - \beta_m^2$ $k_{s,m}^2 = (2\pi/\lambda)^2 \epsilon_r - \beta_m^2$ $k_{s,m} \tan(k_{s,m} s/2) = -\epsilon_p k_{a,m} \tan(k_{a,m} a/2)$ | | (6) (7) (8) | Dispersion relations outside HCG: $\gamma_n^2 = (2\pi/\lambda)^2 - (2\pi/\Lambda)^2$ | | (9) |

Notations: $\epsilon_p^2 = n_r^2$, $\epsilon_p = n_r^2$ for TM and 1 for TE, $\hat{1}_\perp = \hat{x}$ for TM and $\hat{y}$ for TE.

4. The apparatus recited in claim 1, wherein said high-contrast grating is configured to allow selection of a wide range of phases while maintaining a certain reflectivity magnitude.

5. The apparatus recited in claim 1, wherein said high contrast grating comprises parallel bars of material having a high index of refraction and surrounded by a material having a low index of refraction.

6. The apparatus recited in claim 1, wherein said high contrast grating comprises curving bars of material having a high index of refraction and surrounded by a material, or materials, having a low index of refraction.

7. The apparatus recited in claim 6, wherein said high contrast grating comprises concentric circular bars of material having a high index of refraction and surrounded by a material, or materials, having a low index of refraction.

8. The apparatus recited in claim 1, wherein said high contrast grating has grating elements whose spacing is varied along a distribution direction of said high-contrast grating elements to provide varying phase changes along a length of said high-contrast grating to focus said reflection and/or transmission.

9. The apparatus recited in claim 1, wherein the width of the high contrast grating bars vary along a distribution direction of the grating bars which is perpendicular to the length of the grating bars to focus said reflection and/or transmission.

10. The apparatus recited in claim 1, wherein both width and spacing of the high contrast grating bars vary along a distribution direction of the grating bars which is perpendicular to the length of the grating bars to focus said reflection and/or transmission.

11. The apparatus recited in claim 1, wherein the width of the high contrast grating bars varies along the length of one or more grating bars to focus said reflection and/or transmission.

12. The apparatus recited in claim 1, wherein three physical parameters control reflectivity of the grating, comprising spacing, thickness, and width of the grating elements.

13. The apparatus recited in claim 1, wherein said optical energy is focused from a normally incident wave.

14. The apparatus recited in claim 1, wherein said high-contrast grating is configured for receiving said optical energy in a Transverse-Magnetic (TM) polarization.

15. The apparatus recited in claim 1, wherein said high-contrast grating is configured for receiving said optical energy in a Transverse-Electric (TE) polarization.

16. The apparatus recited in claim 1, wherein width and position of each grating element of said high contrast grating are selected in response to selecting a straight or curved line path along a phase contour map which only traverses regions of desired reflectivity.

17. The apparatus recited in claim 16, wherein said width and position of each grating element of said high contrast grating is further determined in response to a bar-by-bar optimization process in which the dimensions of each grating element (bar) is adjusted to minimize energy leakage to a transmission side for a reflector or a reflection side for a lens.

18. An apparatus for focusing optical energy, comprising:
a high-contrast grating (HCG) having grating elements spaced apart from one another;
said grating elements having subwavelength dimensions and an index of refraction at or exceeding approximately 2; and
a low index of refraction material, or materials, surrounding said grating elements;
wherein said HCG is configured to receive an incident wave that is focused for reflection and/or transmission by said HCG;
said grating elements having width and spacing that varies to focus said reflection and/or transmission to a desired location in relation to said grating;
wherein said HCG is chirped in response to varying grating element spacing and/or width along a distribution direction of said grating elements to provide varying phase changes along a length of said HCG to focus said reflection and/or transmission; and
wherein said HCG is configured to provide double focusing with both the reflected and transmitted waves being focused.

19. The apparatus recited in claim 18, wherein the width and/or spacing of the grating elements is configured to vary along a distribution direction of the grating elements which is perpendicular to the length of the grating elements and varies along the length of one or more grating elements to focus said reflection and/or transmission in two dimensions.

* * * * *